US011542731B2

(12) United States Patent
Leonardi et al.

(10) Patent No.: US 11,542,731 B2
(45) Date of Patent: Jan. 3, 2023

(54) SMART HANDLE ASSEMBLY WITH FORCE-BASED SENSOR AND BACKUP ENERGY SOURCE

(71) Applicant: MAGNA CLOSURES INC., Newmarket (CA)

(72) Inventors: Emanuele Leonardi, Pisa (IT); Davide Dente, Pisa (IT); Claudio Cambini, Florence (IT); John G. Zeabari, Highland, MI (US)

(73) Assignee: MAGNA CLOSURES INC., Newmarket (CA)

( * ) Notice: Subject to any disclaimer, the term of this patent is extended or adjusted under 35 U.S.C. 154(b) by 674 days.

(21) Appl. No.: 16/454,528

(22) Filed: Jun. 27, 2019

(65) Prior Publication Data

US 2020/0011096 A1 Jan. 9, 2020

Related U.S. Application Data

(60) Provisional application No. 62/693,590, filed on Jul. 3, 2018.

(51) Int. Cl.
*B60R 25/00* (2013.01)
*E05B 81/76* (2014.01)
*E05B 85/10* (2014.01)
*B60R 16/023* (2006.01)
*E05B 17/00* (2006.01)
(Continued)

(52) U.S. Cl.
CPC .......... *E05B 81/76* (2013.01); *B60R 16/0231* (2013.01); *B60R 25/10* (2013.01); *E05B 17/0091* (2013.01); *E05B 85/10* (2013.01);
*G01L 5/22* (2013.01); *G06F 3/0414* (2013.01); *G07C 5/008* (2013.01); *G07C 5/0825* (2013.01);
(Continued)

(58) Field of Classification Search
CPC ...... E05B 81/76; E05B 17/0091; E05B 85/10; B60R 16/0231; B60R 25/10; B60R 25/23; B60R 25/24; G01L 5/22; G06F 3/0414; G07C 5/008; G07C 5/0825; G07C 5/0833; H03K 17/96
USPC ...................................................... 340/5.72
See application file for complete search history.

(56) References Cited

U.S. PATENT DOCUMENTS 6,038,895 A * 3/2000 Menke .................... E05B 81/84
                                                       70/278.1
7,637,631 B2 12/2009 McDermott et al.
(Continued)

*Primary Examiner* — Kerri L McNally
*Assistant Examiner* — Thang D Tran
(74) *Attorney, Agent, or Firm* — Dickinson Wright PLLC

(57) ABSTRACT

A handle assembly for a closure of a vehicle includes a force-based sensor disposed beneath an uninterrupted class-A surface and responsive to a force applied thereto. The handle assembly includes a handle ECU, configured to monitor the force-based sensor and to communicate with an electronic latch controller. A super-capacitor is disposed on a PCB within the handle assembly for providing electrical power to the handle ECU and the force-based sensor. The handle ECU includes one or more feedback devices such as LED lights, acoustic, and haptic devices to provide information about the status of the closure and the electronic latch system. The handle assembly is also configured to provide different responses to two or more different levels of force applied to the force-based sensor. An output interface in the handle assembly provides wired and wireless backup communications to the electronic latch controller.

13 Claims, 21 Drawing Sheets

(51) Int. Cl.
*G07C 5/00* (2006.01)
*G07C 5/08* (2006.01)
*B60R 25/10* (2013.01)
*G01L 5/22* (2006.01)
*G06F 3/041* (2006.01)
*H03K 17/96* (2006.01)
*B60R 25/23* (2013.01)
*B60R 25/24* (2013.01)

(52) U.S. Cl.
CPC ........... *G07C 5/0833* (2013.01); *H03K 17/96* (2013.01); *B60R 25/23* (2013.01); *B60R 25/24* (2013.01)

(56) References Cited

U.S. PATENT DOCUMENTS

| | | | |
|---|---|---|---|
| 7,911,321 | B2 | 3/2011 | Bingle et al. |
| 8,113,695 | B2 | 2/2012 | Meinke et al. |
| 8,400,265 | B2 | 3/2013 | Sarioglu et al. |
| 9,696,839 | B1 * | 7/2017 | Bingle ............... G06F 3/04883 |
| 9,925,953 | B2 | 3/2018 | Pribisic et al. |
| 10,099,656 | B2 * | 10/2018 | Pribisic ............. H03K 17/9622 |
| 10,394,393 | B2 | 8/2019 | Ramakrishnan et al. |
| 11,136,000 | B2 | 10/2021 | Cumbo |
| 2003/0029210 | A1 * | 2/2003 | Budzynski ............. E05B 85/10 70/264 |
| 2003/0125863 | A1 * | 7/2003 | Tamasho ............... B60T 13/741 303/20 |
| 2006/0262549 | A1 | 11/2006 | Schmidt et al. |
| 2009/0045541 | A1 * | 2/2009 | Lazano ................ B29C 45/372 74/552 |
| 2009/0136288 | A1 * | 5/2009 | Ersoy ..................... B60D 1/58 702/34 |
| 2010/0085147 | A1 | 4/2010 | McCall |
| 2011/0203336 | A1 * | 8/2011 | Mette .................. E05B 47/0611 292/216 |
| 2014/0000165 | A1 * | 1/2014 | Patel ..................... E05B 81/77 292/201 |
| 2014/0316612 | A1 * | 10/2014 | Banter ................... E05B 81/80 701/2 |
| 2014/0368465 | A1 * | 12/2014 | Beilker .................... H05K 1/16 345/174 |
| 2015/0137531 | A1 * | 5/2015 | Papanikolaou ........... B60J 5/00 292/201 |
| 2015/0330112 | A1 * | 11/2015 | Van Wiemeersch .... E05B 77/02 292/201 |
| 2015/0330115 | A1 * | 11/2015 | Kleve .................... E05B 81/14 292/216 |
| 2015/0330116 | A1 * | 11/2015 | Dente .................... B60L 58/15 307/10.1 |
| 2015/0330133 | A1 * | 11/2015 | Konchan ................ E05F 15/63 296/146.4 |
| 2015/0353033 | A1 | 12/2015 | Pribisic et al. |
| 2016/0130843 | A1 * | 5/2016 | Bingle ................... E05B 81/82 292/201 |
| 2016/0251880 | A1 * | 9/2016 | Bingle ................... E05B 81/76 701/49 |
| 2016/0340940 | A1 * | 11/2016 | Krishnan ............... E05B 17/22 |
| 2017/0101076 | A1 * | 4/2017 | Krishnan ............ B60R 25/2045 |
| 2017/0107747 | A1 * | 4/2017 | Dente ................... E05B 81/04 |
| 2017/0260778 | A1 * | 9/2017 | Witte ................. G07C 9/00174 |
| 2017/0306660 | A1 * | 10/2017 | Zimmermann ......... E05B 79/04 |
| 2017/0314302 | A1 * | 11/2017 | Marlia ................... E05B 81/56 |
| 2017/0320532 | A1 * | 11/2017 | Salvaggio, Jr. ........ F21V 23/002 |
| 2017/0342761 | A1 * | 11/2017 | Conner ................. E05F 15/622 |
| 2017/0364760 | A1 * | 12/2017 | Canella ................. G06V 40/19 |
| 2018/0038146 | A1 * | 2/2018 | Linden ................... E05B 81/58 |
| 2018/0038147 | A1 * | 2/2018 | Linden ................. E05F 15/616 |
| 2018/0044949 | A1 * | 2/2018 | Frello .................... E05B 77/14 |
| 2018/0058837 | A1 * | 3/2018 | Dektor ............... H03K 17/9625 |
| 2018/0215346 | A1 | 8/2018 | Pribisic et al. |
| 2018/0347252 | A1 * | 12/2018 | Zeabari ..................... B60J 5/102 |
| 2018/0367139 | A1 | 12/2018 | Pribisic et al. |
| 2019/0049328 | A1 * | 2/2019 | Guillot ................. G01L 19/086 |
| 2019/0085600 | A1 | 3/2019 | Leonardi et al. |
| 2019/0152433 | A1 | 5/2019 | Cumbo |
| 2019/0211590 | A1 * | 7/2019 | Tieman ................... E05B 81/06 |

* cited by examiner

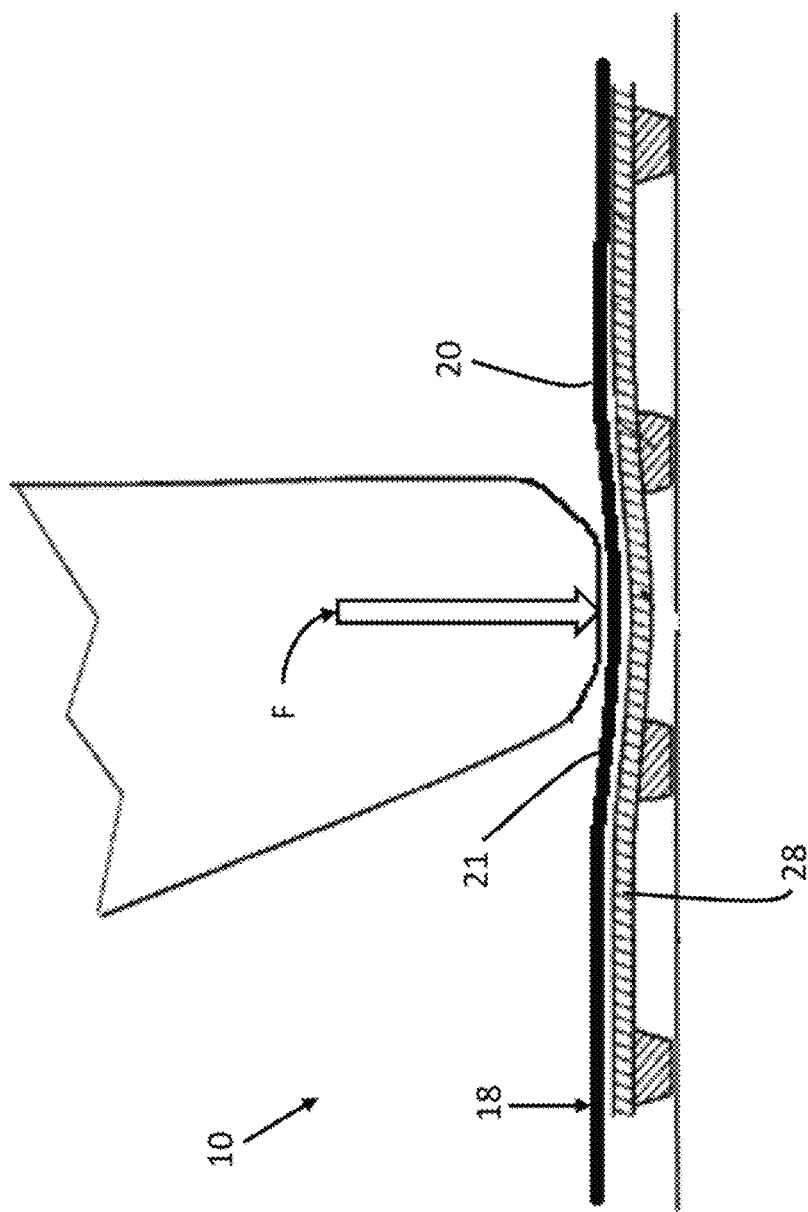

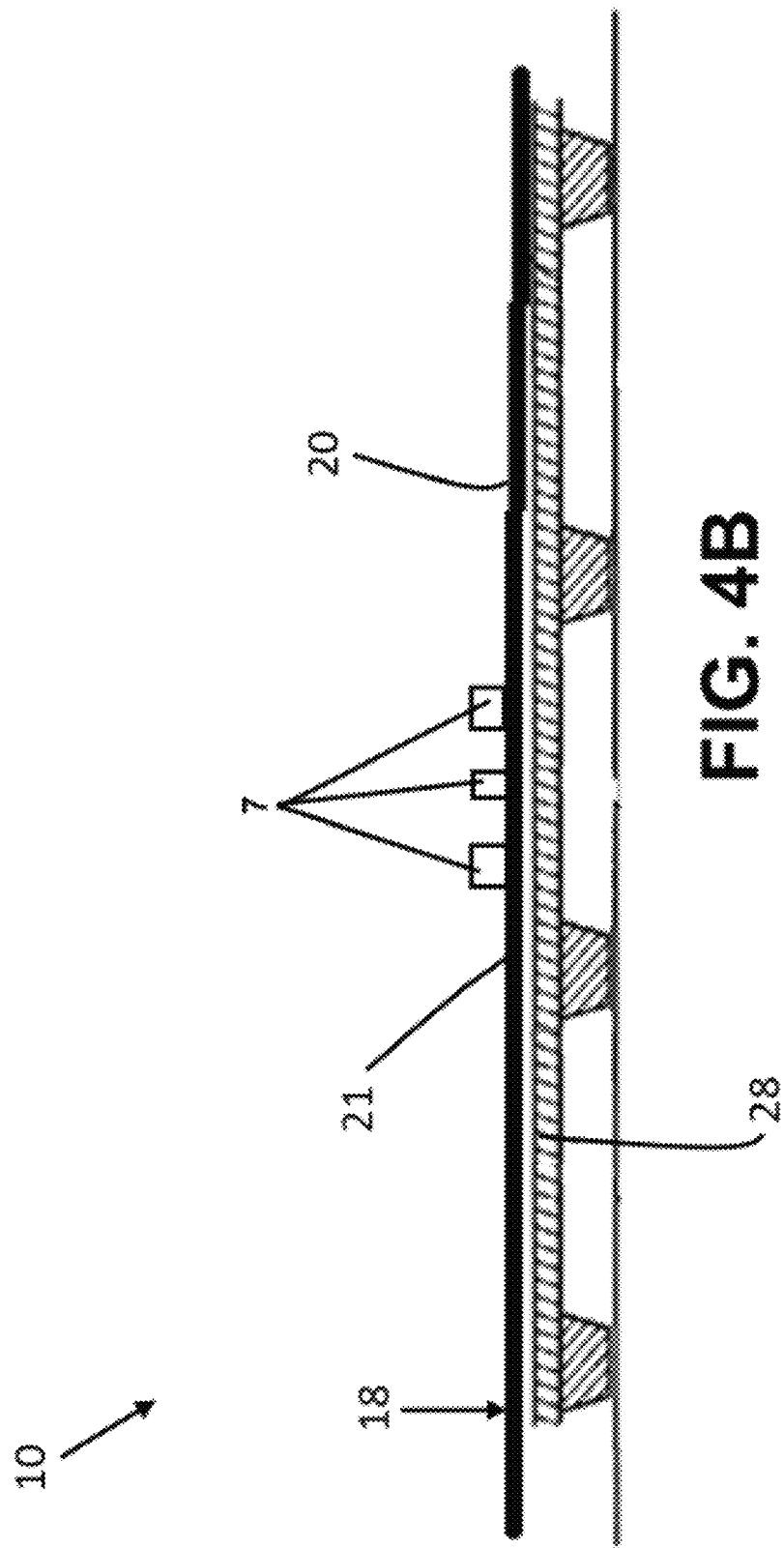

SMART HANDLE ASSEMBLY WITH FORCE-BASED SENSOR AND BACKUP ENERGY SOURCE

CROSS-REFERENCE TO RELATED APPLICATIONS

This application claims the benefit of U.S. Provisional Application No. 62/693,590 filed Jul. 3, 2018. The entire disclosure of the above application is incorporated herein by reference.

FIELD

The present disclosure relates to an electronic handle assembly for a vehicle closure.

BACKGROUND

This section provides background information related to the present disclosure which is not necessarily prior art.

Electronic latch systems, also called smart latches, are becoming increasingly attractive for vehicle manufacturers to replace mechanical linkages between handles and other hardware with latch mechanisms in vehicle closures, such as doors and lift gates or tail gates. A capacitive sensor, such as a touch pad, can be used to replace external handle switch in such a smart latch system, for example, for entry of a code sequence to open, lock, or unlock the door, or a swipe or wave hand gesture. However, capacitive sensors have several disadvantages, such as susceptibility to moisture from rain, melting snow or spilled beverages, which can render switches that use capacitive sensors useless. Further, false activations, due to water presence over the capacitive sensor for example, may unintentionally cause the release or activation of the smart latch. Capacitive sensors are also ineffective at detecting touches by hands covered by items such as gloves or bandages.

Furthermore, electronic sensors, such as capacitive sensors, require electrical power and are not effective to detect a user's touch in case of battery disconnection. This is especially problematic for touch sensors that are intended for use on an outside handle.

SUMMARY

This section provides a general summary of the disclosure, and is not a comprehensive disclosure of its full scope or all of its features.

It is an objective of the present disclosure to provide a handle assembly for a closure of a vehicle having a class-A surface disposed over a force-based sensor responsive to a force applied to the class-A surface, with the class-A surface presenting a smooth and uninterrupted surface in a region around the force-based sensor.

In accordance with another aspect, there is provided a user interface system for a vehicle including a vehicle surface disposed over a force-based sensor responsive to a force applied to the vehicle surface, the vehicle surface presents an uninterrupted surface in a region around the force-based sensor.

It is another objective of the present disclosure to provide such a handle assembly in which the class-A surface is configured to deform in order transmit a force applied thereto to the force-based sensor.

It is another objective of the present disclosure to provide such a handle assembly in which the class-A surface includes a first outer surface facing outwardly from the vehicle and defining a portion of the handle assembly farthest from the closure, with the force-based sensor being responsive to a force applied to the first outer surface.

It is another objective of the present disclosure to provide such a handle assembly in which the class-A surface includes an inner surface facing inwardly toward the vehicle, with the force-based sensor being responsive to a force applied to the inner surface.

It is another objective of the present disclosure to provide such a handle assembly in which the class-A surface includes a second outer surface facing outwardly from the vehicle and defining a portion of the handle assembly adjacent to the closure, with the force-based sensor being responsive to a force applied to the second outer surface.

In accordance with another aspect, there is provided a user interface assembly for a closure of a vehicle including a force-based sensor responsive to a force applied thereto, an interface ECU including a processor configured to monitor the force-based sensor, and a local power source disposed within the user interface assembly for providing electrical power to the interface ECU and the force-based sensor.

It is yet another objective of the present disclosure to provide a handle assembly for a closure of a vehicle including a force-based sensor responsive to a force applied thereto, and a handle ECU including a processor configured to monitor the force-based sensor, with a local power source, such as a super-capacitor, disposed within the handle assembly for providing electrical power to the handle ECU and the force-based sensor.

It is yet another objective of the present disclosure to provide a handle assembly for a closure of a vehicle including a force-based sensor responsive to a force applied thereto, and a handle ECU including a processor configured to monitor the force-based sensor, and a feedback device disposed within the handle assembly and in communication with the handle ECU for providing feedback information regarding one or more conditions and/or events. Such a feedback device may include a visual indicator, a haptic device, and/or an acoustic device to provide an audio signal.

It is yet another objective of the present disclosure to provide a handle assembly for a closure of a vehicle including a force-based sensor responsive to a force applied thereto, with the handle assembly being configured to provide different responses to two or more different levels of force applied to the force-based sensor.

It is yet another objective of the present disclosure to provide a handle assembly for a closure of a vehicle including a force-based sensor responsive to a force applied thereto, and a handle ECU including a processor configured to monitor the force-based sensor, an output interface configured to communicate with an electronic latch controller for operating a latch of the closure via a wired communications path, with the handle ECU configured to communicate with the electronic latch controller via a wireless communications path in response to the wired communications path being unavailable.

It is yet another objective of the present disclosure to provide a handle assembly for a closure of a vehicle including a force-based sensor responsive to a force applied thereto, and a handle ECU including a processor configured to monitor the force-based sensor, an output interface configured to communicate with an electronic latch controller for operating a latch of the closure via a wired communications path.

In accordance with another aspect, there is provided a user interface assembly for a closure of a vehicle including a force-based sensor responsive to a force applied thereto, and an interface ECU including a processor configured to monitor the force-based sensor.

In accordance with another aspect, there is provided a handle assembly for a closure of a vehicle including a vehicle surface disposed over a force-based sensor responsive to a force applied to the vehicle surface, and the vehicle surface presents an uninterrupted surface in a region around the force-based sensor. In accordance with a related aspect, the force-based sensor is disposed upon a printed circuit board and responsive to a deformation thereof, and the printed circuit board is configured to deform in response to the force applied to the vehicle surface. In accordance with a related aspect, the printed circuit board is configured to deform in a first direction in response to an inward force applied to the vehicle surface, and the printed circuit board is configured to deform in a second direction in response to an outward force applied to the vehicle surface in a direction opposite to the inward force. In accordance with a related aspect, the vehicle surface includes a first outer surface facing outwardly from the vehicle and defining a portion of the handle assembly farthest from the closure, and the force-based sensor is responsive to a force applied to the first outer surface. In accordance with a related aspect, the vehicle surface includes an inner surface facing inwardly toward the vehicle, and the force-based sensor is responsive to a force applied to the inner surface. In accordance with a related aspect, the vehicle includes a second outer surface facing outwardly from the vehicle and defining a portion of the handle assembly adjacent to the closure, the force-based sensor is responsive to a force applied to the second outer surface.

In accordance with another aspect of the present disclosure, there is provided a method of operating a user interface for controlling a vehicle operation including the steps of monitoring a force based sensor disposed behind a vehicle surface presenting an uninterrupted surface in a region around said force-based sensor to detect an application of a force on the vehicle surface, and transmitting to a vehicle system a control signal in response to monitoring the force based sensor for controlling the vehicle operation. In accordance with a related aspect, there is further provided the step of generating the control signal as a function of a detected level of force applied to the vehicle surface.

In accordance with another aspect of the present disclosure, there is provided a method of operating a user interface for controlling a vehicle operation including the steps of monitoring a voltage level of a main vehicle battery, supplying voltage from the main vehicle battery to a force based sensor disposed behind a vehicle surface and an interface ECU coupled to the force based sensor in response to the voltage level of the main vehicle battery being above a predetermined threshold, and supplying voltage from a local power source to the force based sensor and the interface ECU in response to the voltage level of the main vehicle battery being below the predetermined threshold.

In accordance with another aspect of the present disclosure, there is provided an access system for a closure panel of a vehicle including a latch assembly having a latch controller, an actuation group controlled by the latch controller, and a backup energy source for supplying power to the latch controller and the actuation group in the event of a failure of a main vehicle power source, the access system further having a user interface assembly including a force based sensor disposed behind a vehicle surface presenting an uninterrupted surface in a region around the force-based sensor to detect an application of a force on the vehicle surface, a user interface controller in communication with the force based sensor and the latch controller and a local backup energy source for supplying power to the user interface controller and the force based sensor in the event of a failure of the main vehicle power source, such that during the failure of the main vehicle power source the user interface controller is configured to receive power from the local backup energy source and is further configured to detect using the force based sensor an application of a force on the vehicle surface, and transmit to the latch controller a control signal for controlling the actuation group using power from the backup energy source.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 4A is a cut-away top view of a portion of a handle assembly in accordance with an embodiment of the disclosure;

FIG. 4B is a cut-away top view of a portion of a handle assembly in accordance with an embodiment of the disclosure;

Corresponding reference numerals indicate corresponding parts throughout the several views of the drawings.

DETAILED DESCRIPTION

Figure 1A:
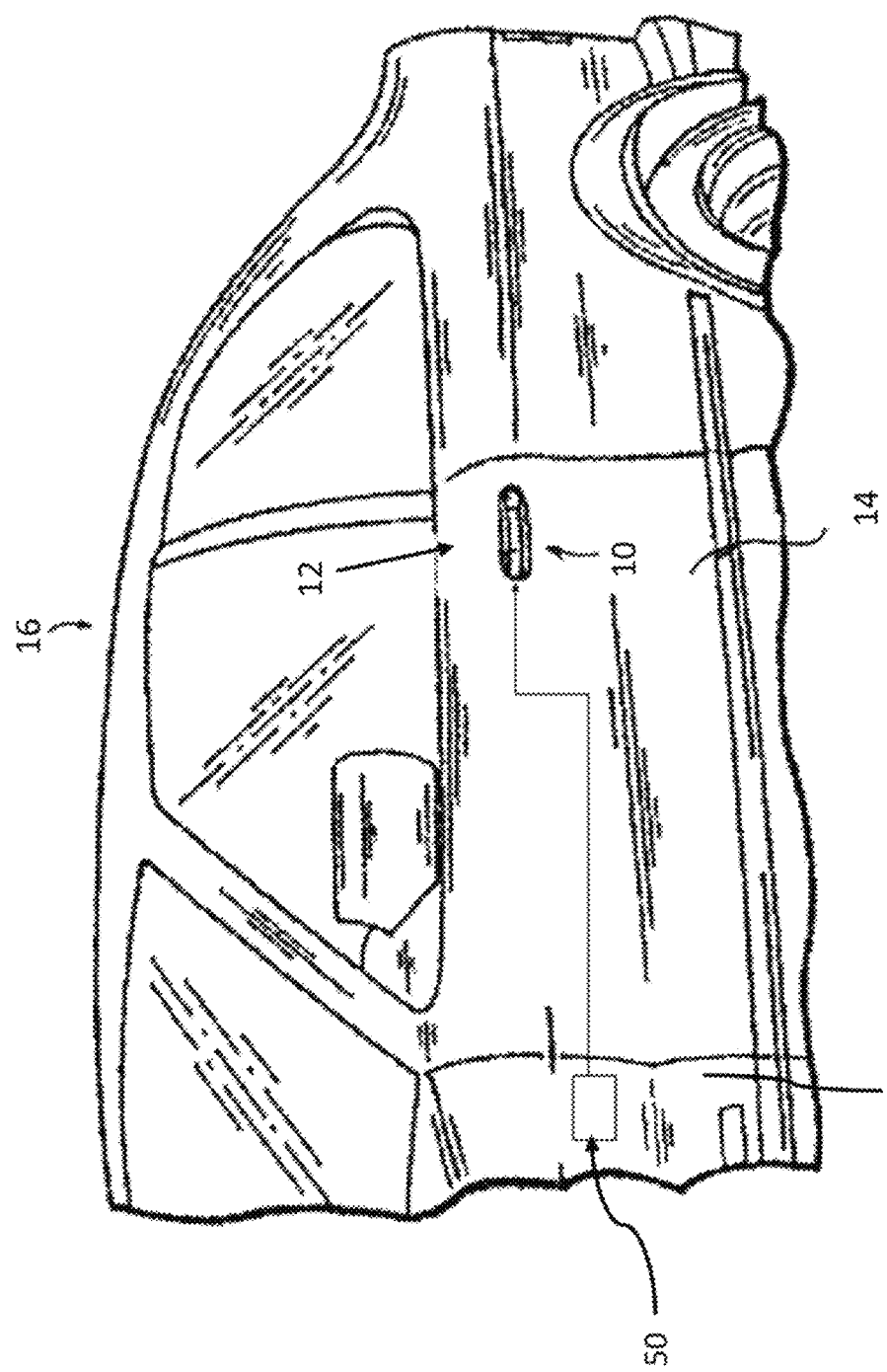
FIG. 1A is a partial perspective view of a vehicle.

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Figure 1B:
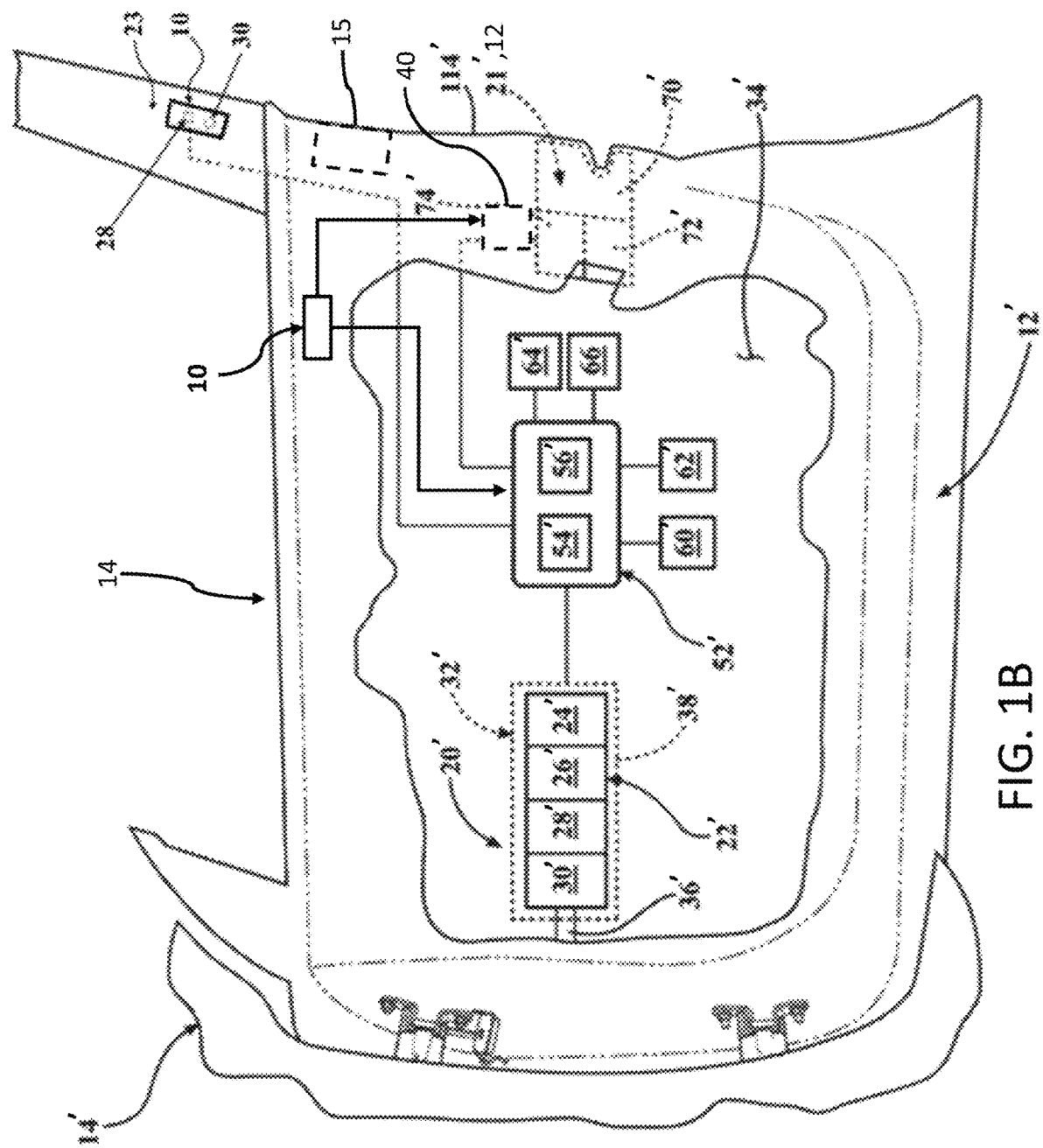
FIG. 1B is a diagrammatic view of a portion of the closure panel shown in FIG. 1A, with various components removed for clarity purposes only, in relation to a portion of the vehicle body and which is equipped with a user interface assembly, in accordance with an illustrative embodiment.

Referring now to FIGS. 1A and 1B, there is provided a power door actuation system 20' is diagrammatically shown in FIG. 1B to include a power-operated swing door presenter mechanism, also referred to as power swing door actuator 32', comprised of an electric motor 24', a reduction geartrain 26', a slip clutch 28', and a drive mechanism 30' which together define powered door presenter assembly 22' that is mounted within an interior chamber 34' of door 14, also referred to as door 12', for moving door 14. Presenter assembly 22' also includes a connector mechanism 36' configured to connect an extensible member of drive mechanism 30' to a portion of vehicle body 14'. Other types of presenter mechanisms may be provided, such as those whereby the connector mechanism 36' remains disconnected with from a portion of vehicle body 14' and is configured to urge or "push" the door 12' to a "presented position" (e.g. to create a 20 mm and 70 mm gap between the door edge 114' and the vehicle body 14'). Presenter assembly 22' further includes a support structure, such as an actuator housing 38', configured to be secured to door 12' within chamber 34' and to enclose electric motor 24', reduction geartrain 26', slip clutch 28' and drive mechanism 30' therein.

As also shown, an electronic control module 52' is in communication with electric motor 24' for providing electric control signals thereto. Electronic control module 52' may also be in communication with user interface assembly/system 10 as described herein below for receiving control signals thereto, for example to command electronic control module 52' to control actuation system 20'. Electronic control system, also referred to electronic control module 52', may include a microprocessor 54' and a memory 56' having executable computer readable instructions stored thereon for execution by the microprocessor 54'. Electronic control module 52' may include hardware and/or software components. Electronic control module 52' can be integrated into, or directly connected to, actuator housing 38' or may be a remotely located device within door chamber 34' or may be integrated into latch assembly 21'.

Although not expressly illustrated, electric motor 24' can include Hall-effect sensors for monitoring a position and speed of vehicle door 12' during movement between its open and closed positions. For example, one or more Hall-effect sensors may be provided and positioned to send signals to electronic control module 52' that are indicative of rotational movement of electric motor 24' (e.g. a motor shaft) and indicative of the rotational speed of electric motor 24', e.g., based on counting signals from the Hall-effect sensor detecting a target on a motor output shaft. In situations where the sensed motor speed is greater than a threshold speed and where the current being supplied to the motor 24' (e.g. as detected by a current sensor or sensing circuitry) registers a significant change in the current draw, electronic control module 52' may determine that the user is manually moving door 12' while motor 24' is also operating, thus moving vehicle door 14. Electronic control module 52' may then send a signal to electric motor 24' to stop motor 24' and may even disengage slip clutch 28' (if provided) to facilitate manual override movement. Conversely, when electronic control module 52' is in a power open or power close mode and the Hall-effect sensors indicate that a speed of electric motor 24' is less than a threshold speed (e.g., zero) and a current spike is registered either directly or indirectly by microprocessor 54' and/or any current sensing circuitry, electronic control module 52' may determine that an obstacle is in the way of vehicle door 12', in which case the electronic control system may take any suitable action, such as sending a signal to turn off electric motor 24'. As such, electronic control module 52' receives feedback from the Hall-effect sensors to ensure that a contact obstacle has not occurred during movement of vehicle door 12' from the closed position to the partially-open position, or vice versa. Other position sensing techniques to determine that the door 12' is being moved, either by the electrical motor 24' and/or a manual user control are also possible.

Also is also schematically shown in FIG. 1B, electronic control module 52' can be in communication with a remote key fob 60' and/or with an external door-mounted switch 62' (contact such as a piezoelectric switch, or contactless such as a capacitive sensor) for receiving a request from a user to open or close vehicle door 12'. Put another way, electronic control module 52' receives a command signal from either remote key fob via a key fob sensor 60' and/or door switch 62' to initiate an opening or closing of vehicle door 12'. Upon receiving a command, electronic control module 52' proceeds to provide a signal to electric motor 24' in the form of a pulse width modulated voltage (for speed control) as an example to turn on motor 24' and initiate pivotal swinging movement of vehicle door 12'. While providing the signal, electronic control module 52' also obtains feedback from the Hall-effect sensors of electric motor 24' to ensure that a contact obstacle has not occurred. If no obstacle is present, motor 24' will continue to generate a rotational force to actuate spindle drive mechanism 30'. Once vehicle door 12' is positioned at the desired location, motor 24' is turned off and the "self-locking" gearing associated with gearbox 26' causes vehicle door 12' to continue to be held at that location, thereby providing an automatic door checking function. If a user tries to move vehicle door 12' to a different operating position, electric motor 24' will first resist the user's motion (thereby replicating a door check function) and eventually release and allow door 12' to move to the newly desired location. Again, once vehicle door 12' is stopped, electronic control module 52' will provide the required power to electric motor 24' to hold it in that position. If the user provides a sufficiently large motion input to vehicle door 12' (i.e., as is the case when the user wants to close the door), electronic control module 52' will recognize this motion via the Hall effect pulses and proceed to execute a full closing operation for vehicle door 12'.

Electronic control module 52' can also receive an additional input from proximity sensor, such as a radar sensor 64' positioned on a portion of vehicle door 12', such as on a door mirror 65' or the like. Radar sensor 64' detects if an obstacle, such as another car, tree, or post, is near or in close proximity to vehicle door 12'. If such an obstacle is present, radar sensor 64' will send a signal to electronic control module 52' and electronic control module 52' will proceed to turn off electric motor 24' to stop movement of vehicle door 12', thereby preventing vehicle door 12' from hitting the obstacle. This provides a non-contact obstacle avoidance system. In addition, or optionally, a contact obstacle avoidance system, such as a pinch detection system, can be placed in vehicle 10' which includes a contact sensor 66 mounted to door, such as in association with molding component 67', and which is operable to send a signal to controller 52' that an obstacle is detected, such as a user's finger detected in a gap between the vehicle body 14' and the door 12'.

Power door actuation system 20' is also shown schematically in FIG. 1B with latch assembly 21' having a latch mechanism 70', a latch release mechanism 72', and a power-operated release actuator such as an electric power release motor 74'. For purposes of illustration only control module 52' is shown in communication with electric power release motor 74' so as to also act as a latch controller for controlling operation of latch assembly 21'. Alternatively, latch assembly 21' may be provided with its own latch controller 40 in a manner as described herein below. Control module 52' can be an integrated configuration or a pair of distinct controllers associated with presenter assembly 22' and latch assembly 21'. Key fob sensor 60' and/or door switch 62' are again used to authenticate the user and control the power release (and power lock) function.

Figure 2A:
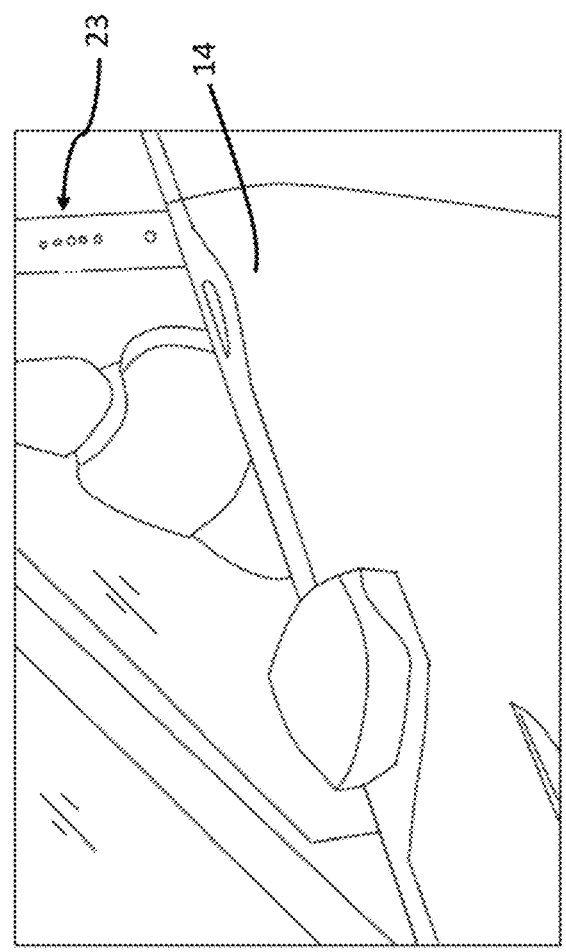
FIG. 2A is partial perspective view of a closure of a vehicle including a handle assembly.
Figure 2B:
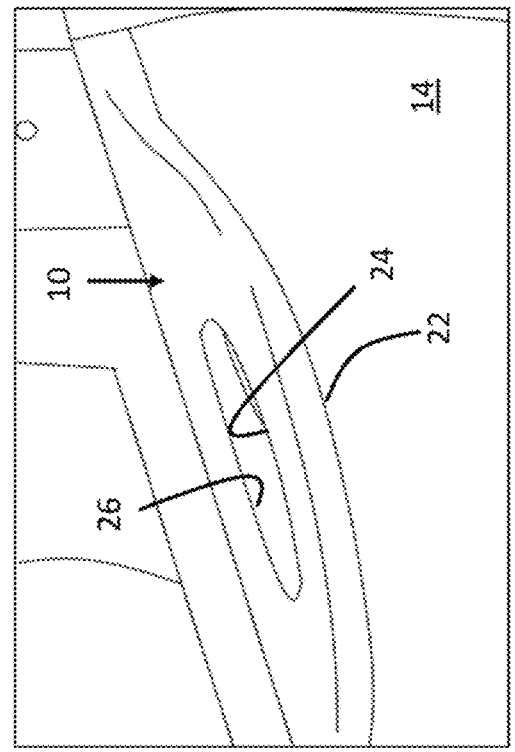
FIG. 2B is an enlarged view of the handle assembly of FIG. 2A.
Figure 3:
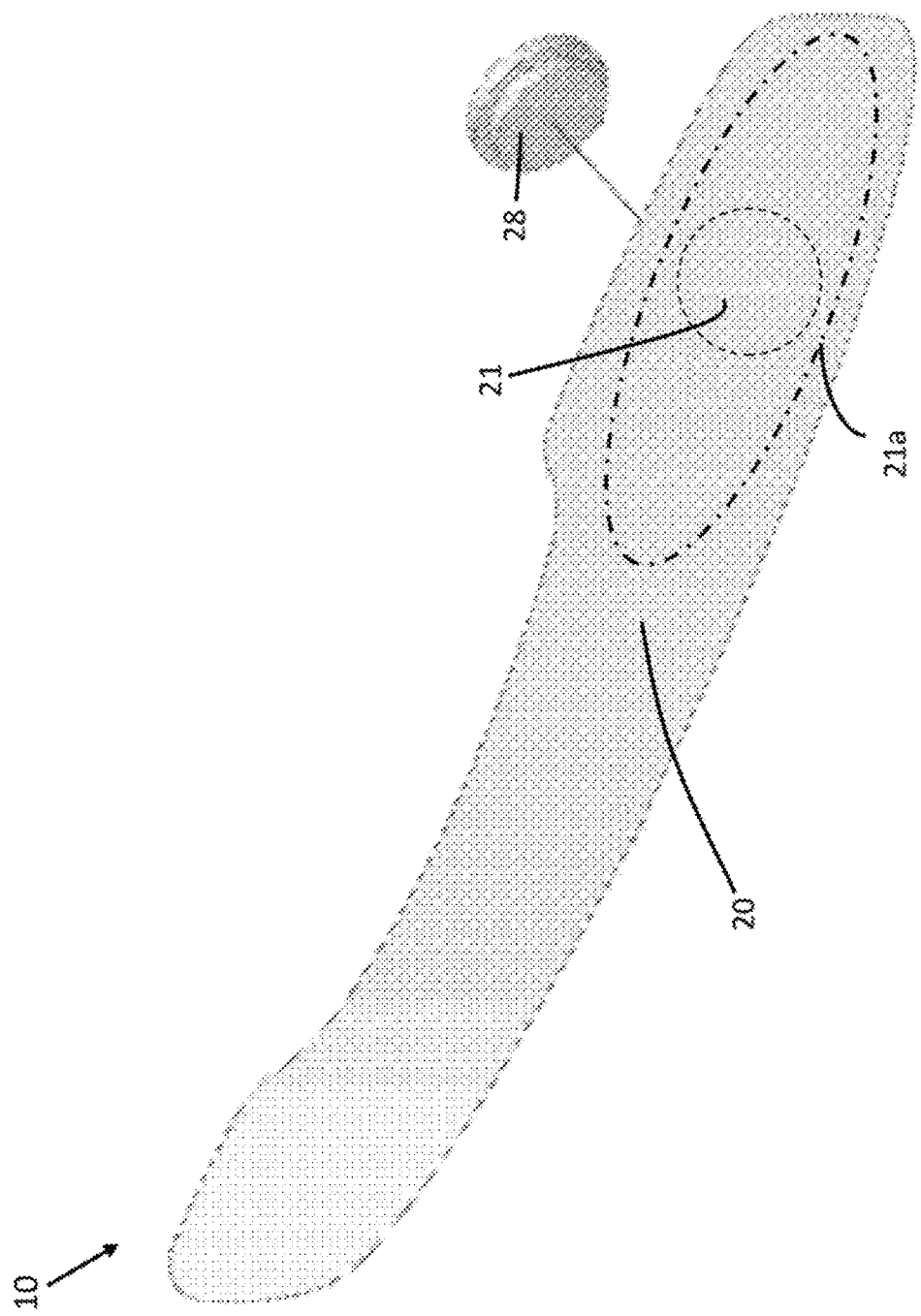
FIG. 3 is a schematic diagram of a handle assembly in accordance with an embodiment of the disclosure.

Referring now to FIG. 1A, 1B, 2A, 2B, and 4, a user interface assembly 10, illustrated as a handle assembly 10, for an electronic latch system 12 in a closure 14 of a vehicle 16 is disclosed. The handle assembly 10 includes a cover 18, such as a bezel, defining a vehicle surface, such as class-A surface 20 for example, overlying a force-based sensor 28 responsive to a force applied to the class-A surface 20. A force-based sensor 28 is a device that changes an electrical property, such as an increase in conductance or capacitance, in response to application of a physical force. A force-based sensor 28 is distinguishable from a capacitive switch that senses the presence of a nearby object by a change in capacitance or disruption in an emitted electromagnetic field. A class-A surface 20 is a physical surface that is intended to be directly viewed and/or touched by users of the vehicle 16. As illustrated in FIG. 3, the class-A surface 20 presents an uninterrupted surface, which may be smooth for example, at least in a touch-sensitive region 21 around the force-based sensor 28, and for example is free of any through openings and gaps for independently moveable portions, such as the moveable body of a switch.

As shown in the cut-away view of FIG. 4A, the touch-sensitive region 21 may be configured to deflect and/or to deform in response to a force applied thereto, for example, by being pushed by a user's fingertip. FIG. 4B illustrates a configuration whereby wherein the vehicle surface 20 includes a tactile feature 7 disposed on the vehicle surface 20, where the tactile feature 7 may be formed to the configuration of braille, a raised or embossed logo, a symbol, a text, a depression, or a proturbance, as examples for indicating to a user either visually or tactilely the location of the force sensor 28 now disposed behind vehicle surface 20.

As a result of the deflection or flexing of the touch-sensitive region 21, the force-based sensor 28 disposed beneath may register the touch. The force-based sensor 28 may be disposed adjacent a back side, opposite the class-A surface 20. The force-based sensor 28 may be configured to detect an application force F on the touch sensitive region 21, but also in a larger adjacent region 21a of the touch sensitive region 21 which may receive the application of a force F and cause a deflection or flexing of touch sensitive region 21, as a result a larger detection zone is possible to receive a force input, or application of force, as compared with a physical switch without having to accommodate a moveable body of the switch over the larger region 21a.

Force-based sensors 28 provide several advantages over other types of switches, such as capacitive switches. For example, force-based sensors 28 may be actuated by a gloved hand and are not prone to false signals such as may be caused by exposure to moisture or other environmental factors. A force-based sensor 28, instead, relies on mechanical pressure to eliminate accidental activation.

According to an aspect, and as best illustrated with reference to FIG. 2B, the class-A surface 20 is illustratively shown as provided on a vehicle handle, and includes a first outer surface 22 facing outwardly from the vehicle 16 and defining a portion of the handle assembly 10 farthest from the closure 14, and with the force-based sensor 28 being responsive to a force applied to the first outer surface 22. In other words, the touch-sensitive region 21 is located in the first outer surface 22 of the handle assembly 10. Such a configuration may be used, for example, for a button that is responsive to a touch by a user's thumb with the user's hand gripping the handle assembly 10, and which may be used to lock and/or unlock one or more of the closures 14 of the vehicle 16, which are illustrative examples of a vehicle operation and specifically examples of latch operations of a latch assembly, for example of latch assembly 21'. The class-A surface 20 may be provided as another example as part of a vehicle applique assembly 23 provided on the B-pillar portion of the door 14, as illustrated in U.S. Pat. No. 10,099,656 entitled "Swipe and tap verification for entry system using swipe and tap touch switch", the entire contents of which are incorporated by reference herein. The vehicle surface, or class-A surface 20, may be provided at other surfaces of the vehicle 16 including exterior surfaces such as for example on a litigate, a hood, a sliding door, as well as on an interior vehicle surface, such as a center media console, a door mounted window control panel, steering wheel controls, as the like. The vehicle surface, or class-A surface 20, may be provided at other surfaces of the door 14, such as on an inner surface of door 14 along door edge 114'.

According to another aspect, and as best illustrated with reference to FIG. 2B, the class-A surface 20 includes an inner surface 24 facing inwardly toward the vehicle 16, and with the force-based sensor 28 being responsive to a force applied to the inner surface 24. In other words, the touch-sensitive region 21 is located in the inner surface 24 of the handle assembly 10. Such a configuration may be used, for example, for a button that is responsive to a touch by one or more fingers with a user's hand gripping the handle assembly 10, and which may be used to open or to unlatch the closure 14. In an embodiment, four touch-sensitive regions 21 with the force-based sensor 28 may be provided, each corresponding to one of the user's four fingers. It is recognized that vehicle surface 20 may be provided on an inwardly facing portion, which may be provided, for example, as phantom outline 15 shown adjacent the inner edge 114' region of the side door 14 on FIG. 1B. Advantageously, different sequences of activations of the force-based sensors 28 may be provided when a user is grasping the handle assembly 10, without the sequence being readily determinable by a bystander as compared to existing capacitive switches disposed on an appliqué requiring a visible input by the user. Other numbers of touch-sensitive region 21, such as one, two, or three, or even none may be provided. Further, force-based sensor 28 may be configured to output a variable electrical signal, in an analog form or a digital form, in response to a varying level of applied force input F further rendering the input less determinable by a bystander, as well as providing for more levels of user input to a user without requiring intricate motion gestures compared to existing capacitive sensors.

According to another aspect, and as best illustrated with reference to FIG. 2B, the class-A surface 20 includes a second outer surface 26 facing outwardly from the vehicle 16 and defining a portion of the handle assembly 10 adjacent to the closure 14, and with the force-based sensor 28 being responsive to a force applied to the second outer surface 26. In other words, the touch-sensitive region 21 is located in the second outer surface 26 of the handle assembly 10. Such a configuration may be used, for example, for a button that is responsive to a touch, and which may be used to close, to latch, and/or to lock the closure 14, and to control other vehicle systems such as a power door actuation system 20', a Body Control Module (BCM), window controller, door module controller 52', as examples.

Figure 5:
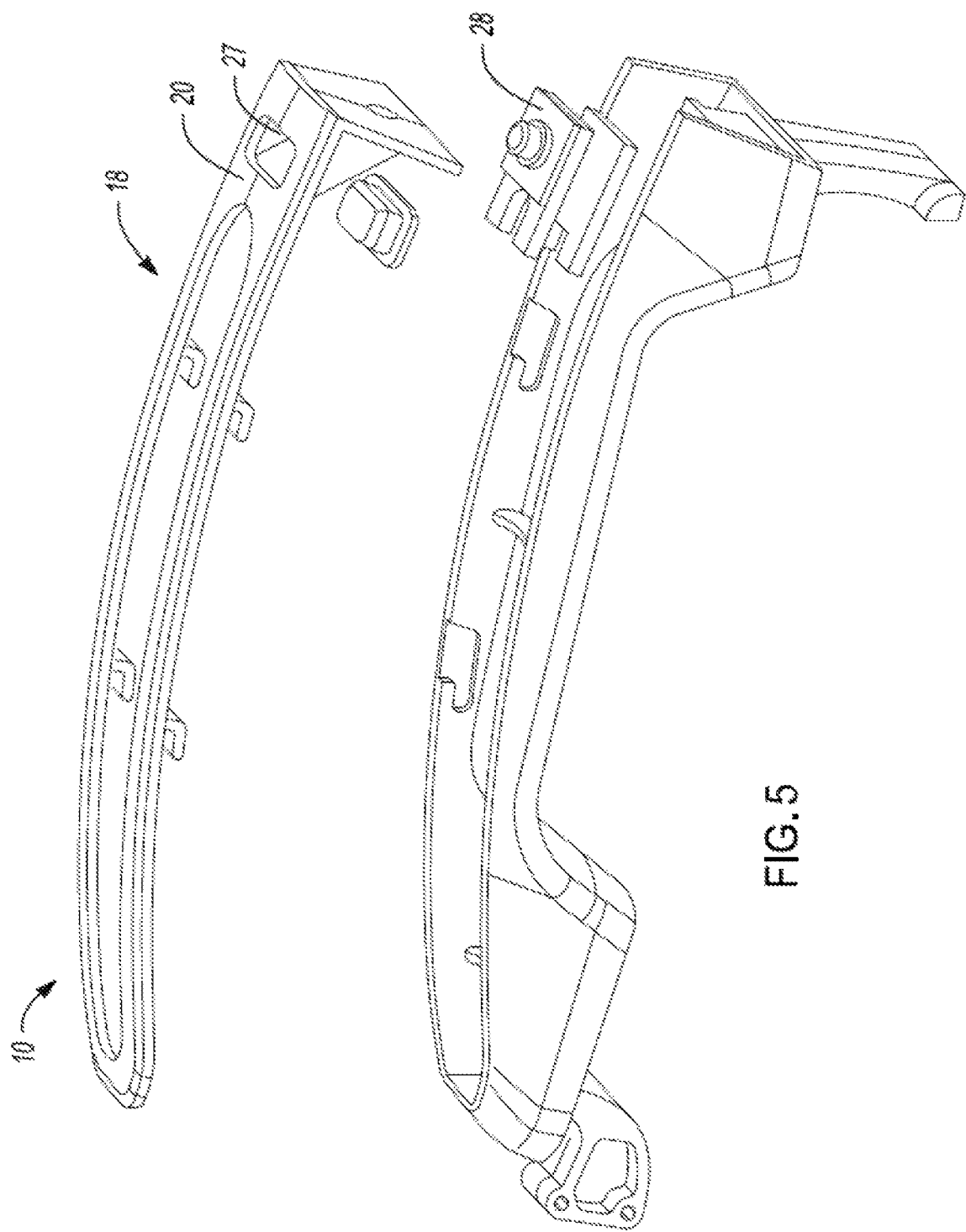
FIG. 5 is an exploded perspective view of a handle assembly of the prior art.
Figure 6:
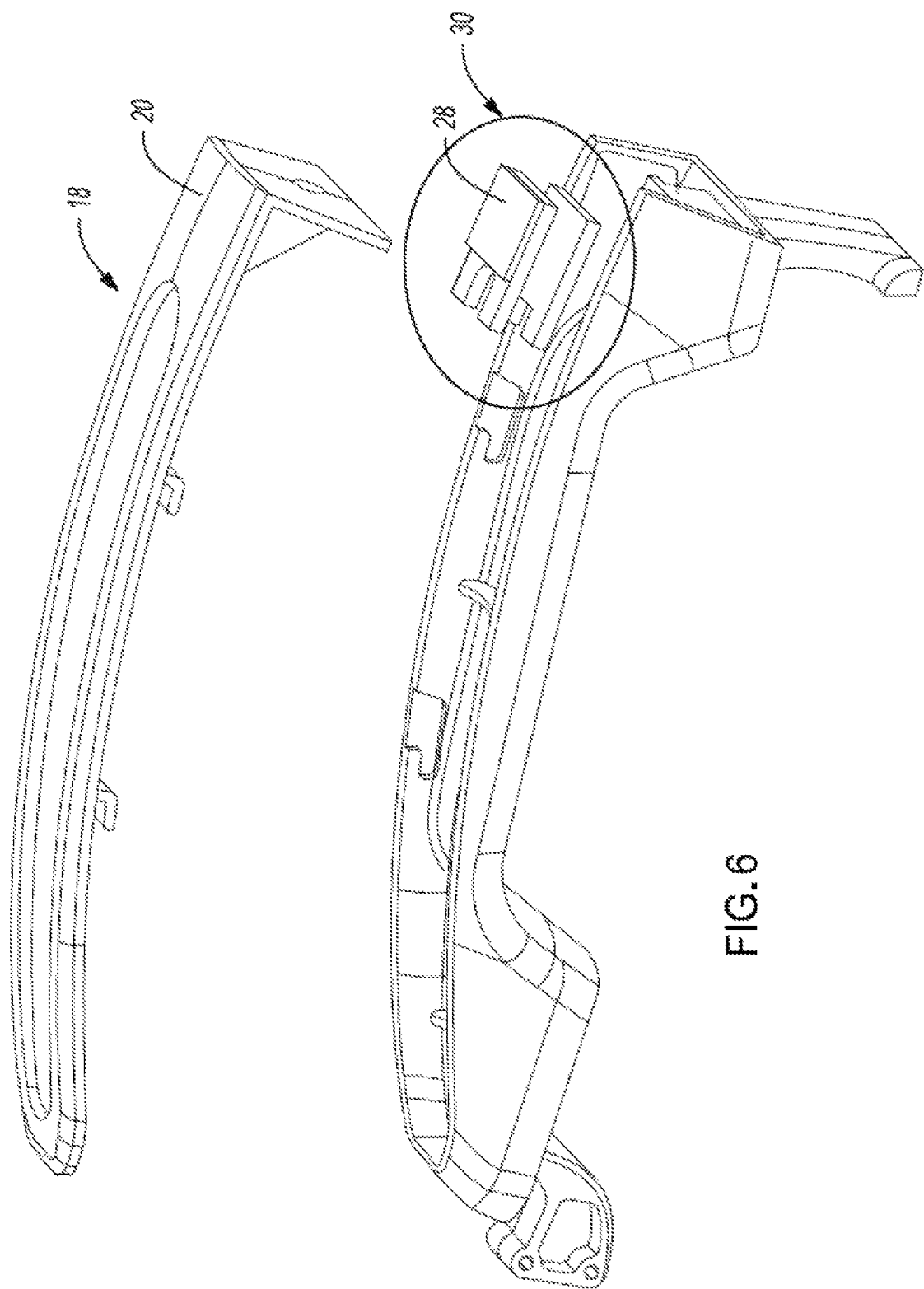
FIG. 6 is an exploded perspective view of a handle assembly in accordance with an embodiment of the disclosure.

A handle assembly 10 of the prior art is shown in an exploded view FIG. 5, and which includes a cover 18 defining a class-A surface 20, and with a hole 27 extending therethrough to allow actuation of a mechanical switch, such as a piezoelectric switch configured for an ON or OF state in response to a force applied thereto. This is distinguished from the handle assembly 10 shown in FIG. 6, in which the class-A surface 20 around the force-based sensor 28 is uninterrupted, and provided without a hole, which may interrupt the smooth appearance of the class-A surface 20, as well as provide an entry way for moisture and water to seep therethrough and enter in behind the class A surface. This is also to distinguished from the handle assembly 10 shown in FIG. 6, in which the force-based sensor 28 is responsive to different levels of force input and providing force input representative output signals. The uninterrupted vehicle surface 20, such as a class-A surface 20 provided in the present disclosure provides several advantages over the prior art arrangement with a hole. It provides a smoother and more attractive appearance, it may be more resilient and resistant to the elements, such as precipitation. It may also be easier and/or less expensive to manufacture and/or assemble, as the force-based sensor of the present disclosure is protected by the cover 18, so it does not need to withstand exposure to the elements, such as water or sunlight.

Figure 7:
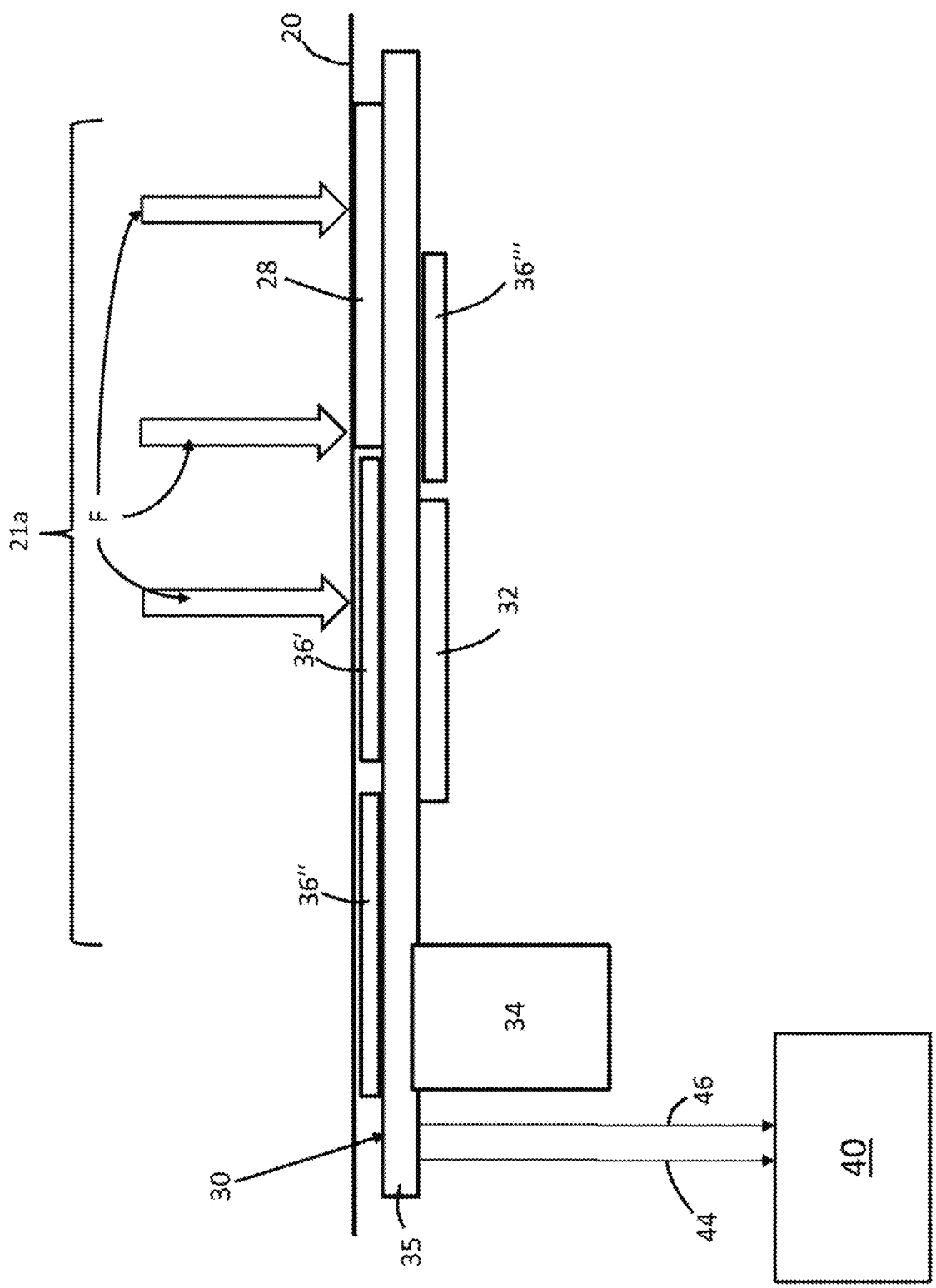
FIG. 7 is simplified side view of a handle ECU in accordance with aspects of the disclosure.
Figure 8:
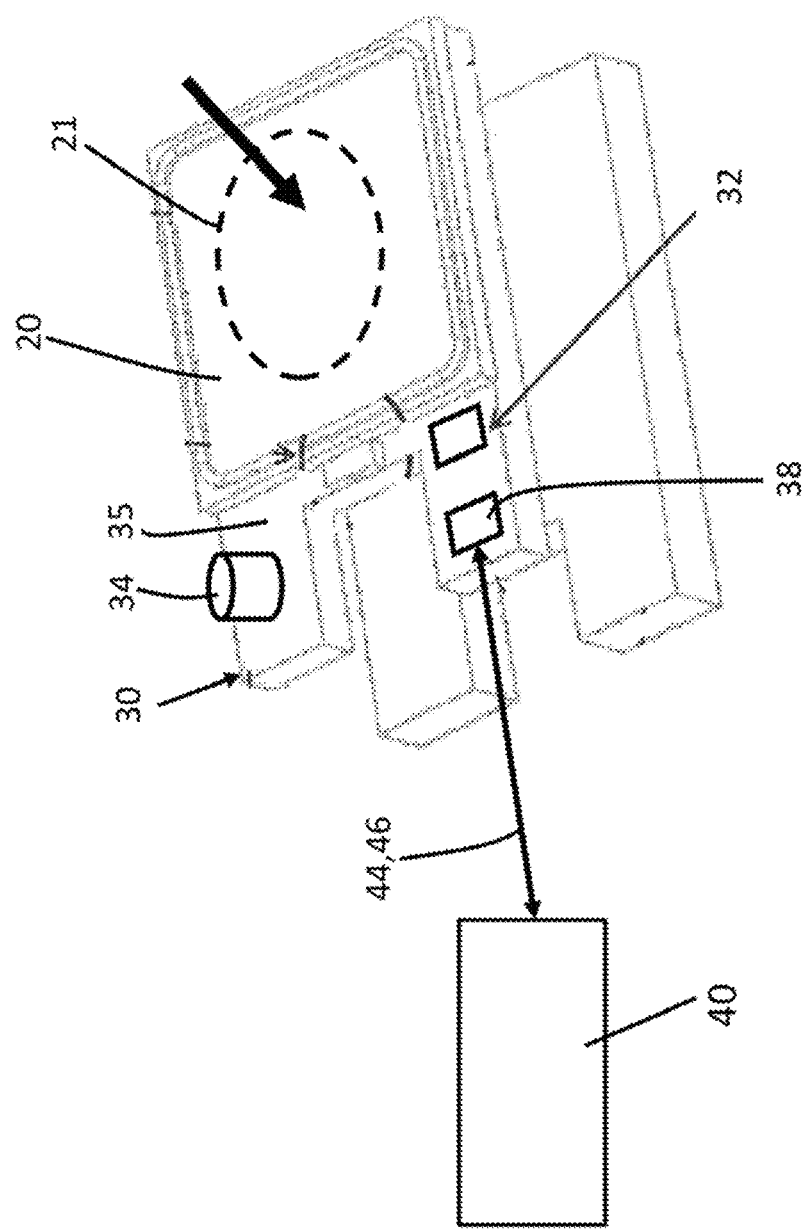
FIG. 8 is perspective view of a handle ECU in accordance with aspects of the disclosure.

As shown in the diagram of FIG. 7, the force-based sensor 28 may be provided as part of an interface electrical control unit (ECU), and with reference for example to the handle assembly 10, a handle electrical control unit (ECU) 30, also referred to as a controller, which is located partially or entirely within the handle assembly 10 and for example enclosed within a cavity defined by the handle assembly 10 defining a housing. The controller 30, or handle ECU 30 also includes a processor 32, such as a microprocessor or microcontroller, configured to monitor the force-based sensor 28. The processor 32 executes one or more programs stored a computer-readable memory, which may be located within the same package or remotely from the microprocessor or microcontroller, and for example may be configured to execute the steps stored in a memory as illustratively provided in FIGS. 17 to 19 as examples and as will be described in more details herein below. A local power source 34, or backup energy source, is disposed within the handle assembly 10 for providing electrical power to the handle ECU 30 and the force-based sensor 28. The local power source 34 may be a super-capacitor such as, for example, an Electrostatic double-layer capacitor (EDLC). The local power source 34 could be another source of electrical energy, such as a battery. As indicated on FIG. 7, the local power source 34 may be mounted to a handle printed circuit board (PCB) 35, also supporting the processor 32, memory 32a for storing suitable instructions and/or programs relating to for example methods and steps for configuring handle ECU 30 to control the user interface assembly 10, with memory 32a being electrically coupled to the processor 32, and other electrical components, and/or circuitry and may be aligned as necessary for packaging within the handle assembly 10. For example, the local power source 34 may be aligned generally parallel or generally perpendicularly to the handle PCB 35. It is recognized that the handle ECU 30 could alternatively comprise a logical circuit of discrete components to carry out the functions of the processor 32 and memory 32a.

In accordance with a further aspect, a feedback device 36 may be disposed within the handle assembly 10 and in communication with the handle ECU 30 for providing feedback information regarding one or more conditions and/or events. For example, the a feedback device 36 may be mounted to the handle printed circuit board 35 and be electrically coupled to the handle ECU 30. The feedback device 36 may include a visual indicator 36', such as one or more LED lights, which may be visible through the cover 18 of the handle assembly 10, for example as a result of a portion of the handle assembly 10 formed from a light transmissive material. To facilitate viewing of the LED lights, the cover 18 may be transparent, semi-transparent, or translucent. The feedback device 36 may additionally or alternatively include a haptic device 36", such as a mechanical vibrator, to provide tactile feedback to a user. The feedback device 36 may additionally or alternatively include an acoustic device 36''', such as a beeper, buzzer, or speaker, to provide an audio signal as feedback to a user.

The feedback devices 36 may provide information about the status of the closure 14, for example, whether it is locked or unlocked or whether it is ajar, or fully latched. The feedback devices 36 may also provide a confirmation signal that the force-based sensor 28 was successfully or unsuccessfully actuated to accomplish the intended function. For example, a chime sound, and/or vibration, and/or green light could accompany an actuation of the force-based sensor 28 that successfully actuates to closure 14 to be opened. A buzzer and/or red light could accompany an actuation of the force-based sensor 28 that is not successful in accomplishing the intended function, which could happen, for example, if the closure 14 is in a locked condition.

The handle assembly 10 may also be configured to provide different responses to two or more different levels of force applied to the force-based sensor 28. The force-based sensor 28 may provide different output signals and/or different signal levels, such as a different voltage or electrical current to the processor 32 with different amounts of force applied to the force-based sensor 28. Processor 32 may be electrically connected to terminals of the force-based sensor 28 to detect changes in capacitance of the terminals as an example. For example, the handle assembly 10 may cause only the one door 14 where the handle assembly 10 is located to unlock in response to the application of a light force, and the handle assembly 10 may cause all of the doors 14 to unlock in response to the application of a heavier force.

Figure 9:
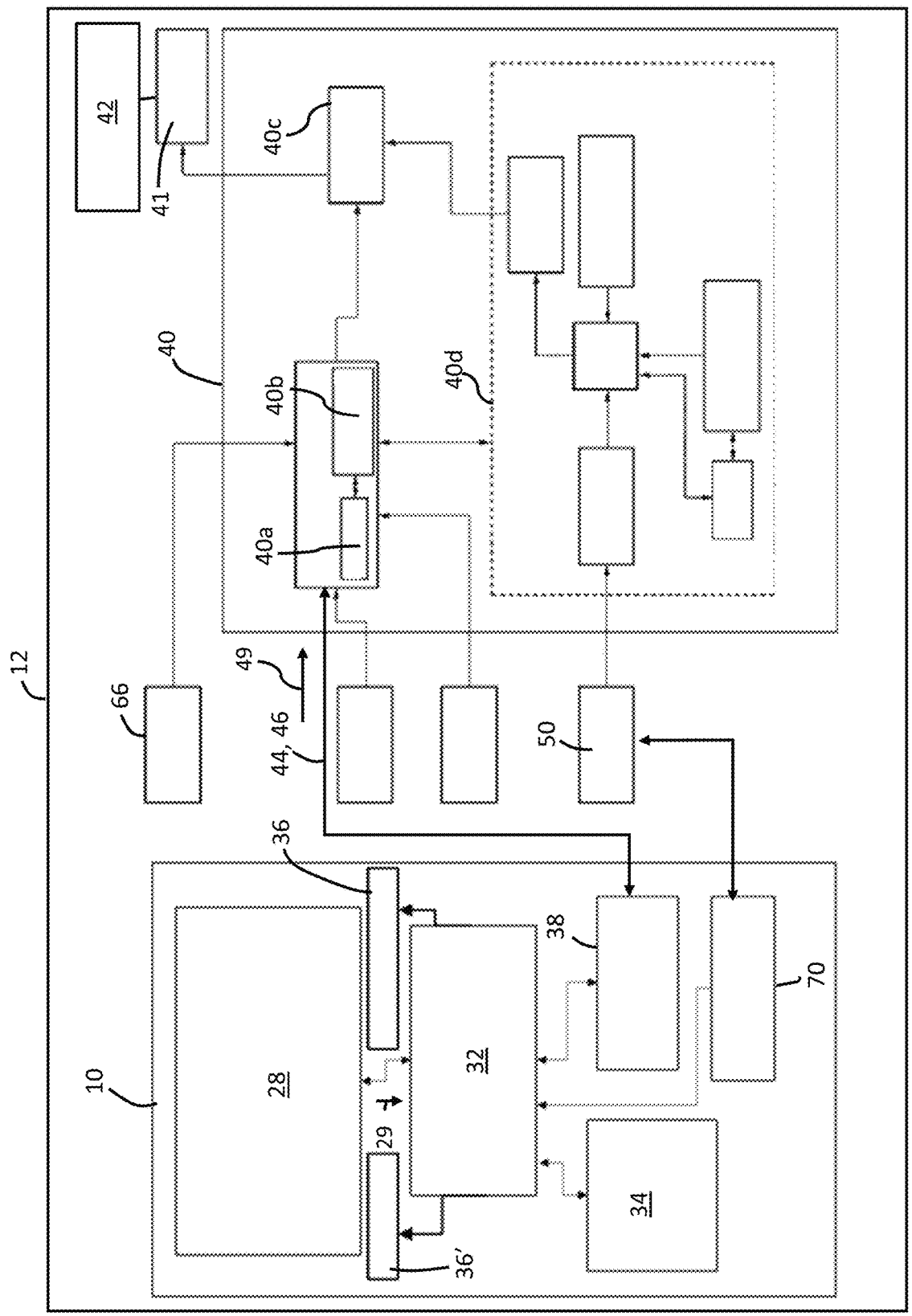
FIG. 9 is a block diagram of an electronic latch system in accordance with aspects of the disclosure.
Figure 10:
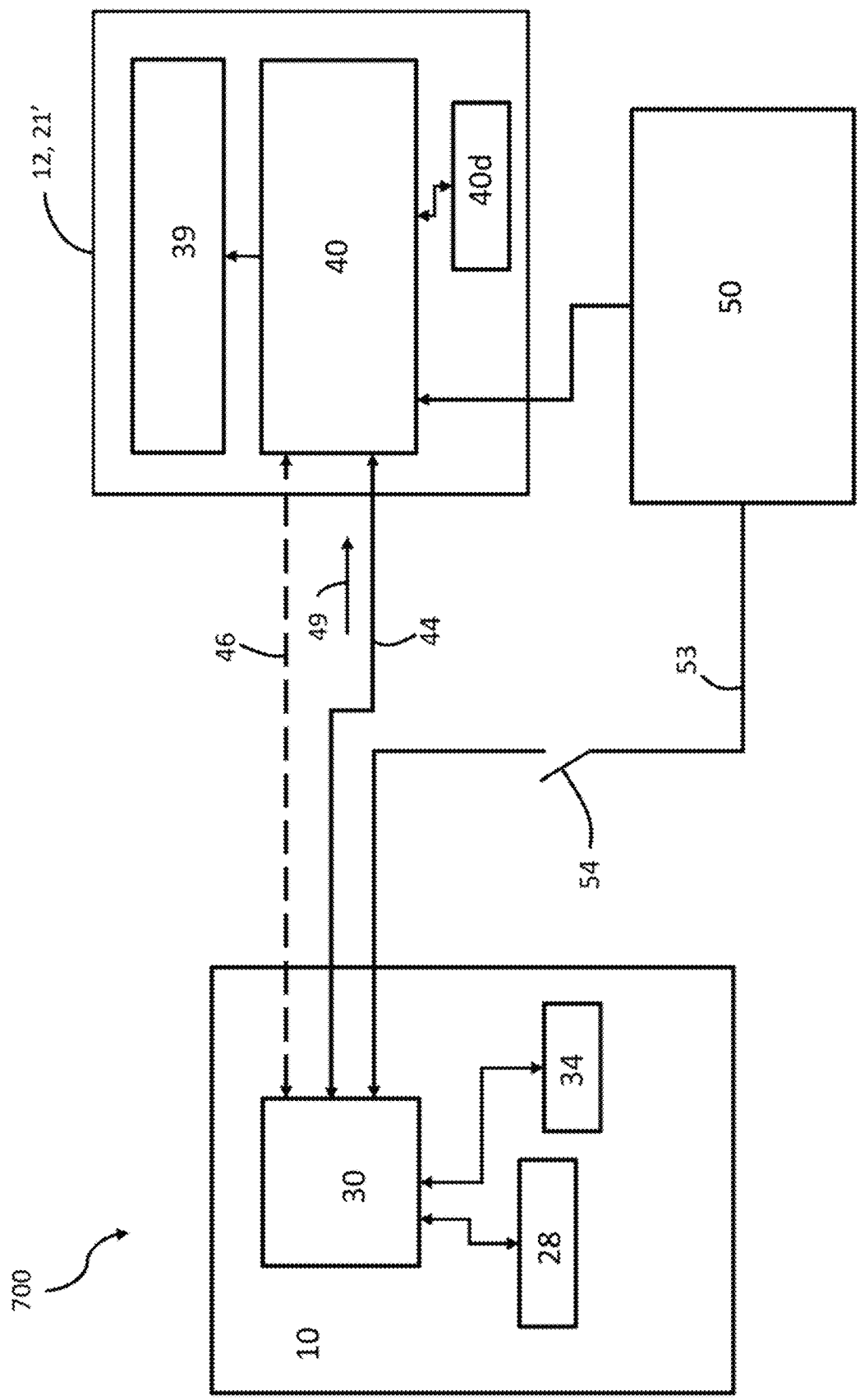
FIG. 10 is a block diagram of an electronic latch system in accordance with aspects of the disclosure.
Figure 11:
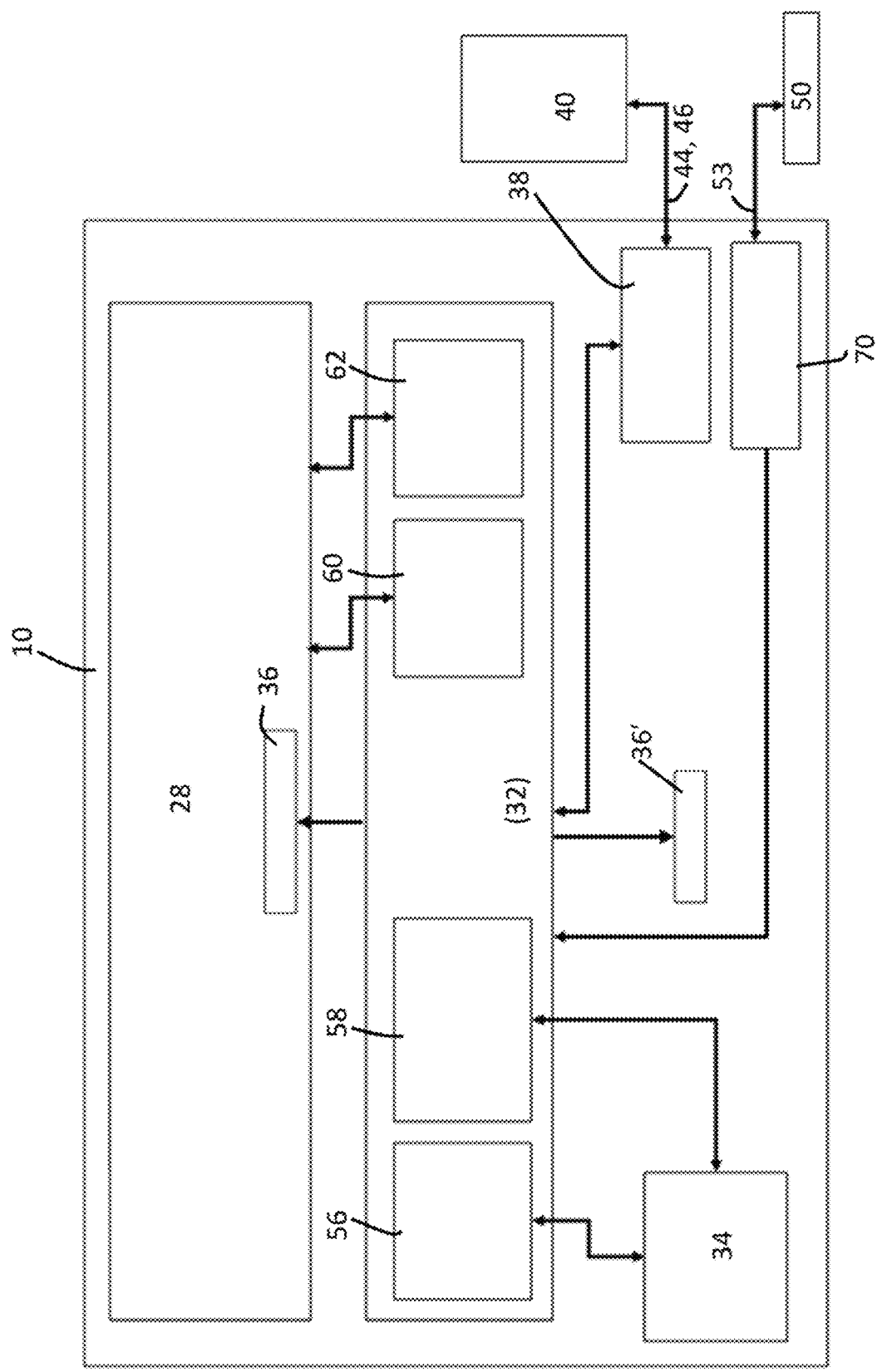
FIG. 11 is a block diagram of a handle assembly for an electronic latch system in accordance with aspects of the disclosure.
Figure 12:
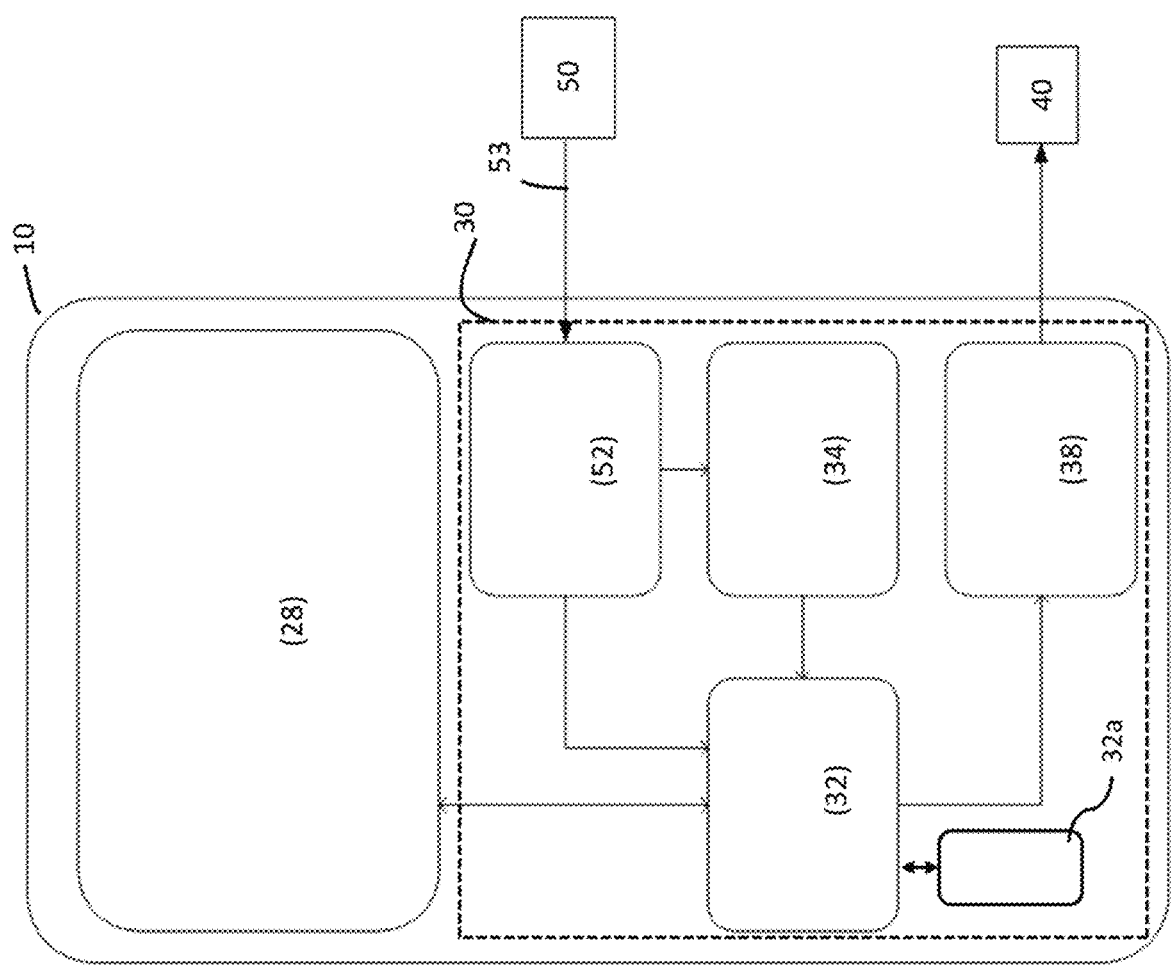
FIG. 12 is a block diagram of a handle assembly for an electronic latch system in accordance with aspects of the disclosure.

As best illustrated in the block diagrams of FIGS. 9 and 11, the handle assembly 10 includes an output interface 38 configured to communicate with an electronic latch controller 40 for controlling an actuation group having for example an actuator 41 for operating a latch 42 of the closure 14. As shown in FIG. 10, a wired communications path 44 is provided between the handle ECU 30 and the electronic latch controller 40 for transmitting a control signal 45 generated by handle ECU 10. Control signal 45 may be a high (for example 5 Volts) or low signal (for example 0 Volts) indicating to controller 40 to actuate the actuation group 39 for example supply power to actuator 41, in response to latch controller 40 detecting line 44 being drive high. Control signal 45 may be a more complex signal such as a digital signal encoding a command in a digital format such as "Lock", "Unlock", "Power Release", for example based on the detected application of force by the force sensor 28 as generated by the controller 30. Controller 30 may be configured to process the signal output 29, for example to determine the level of force detected by the force sensor 28, and associate the level of force detected with a vehicle operation, such as a latch operation, for example using a lookup table. For example controller 30 may generate a Lock signal based on a detected force level for example one newton, and generate a Lock control signal 49, an example of a first control signal. For example controller 30 may generate a Lock signal based on a detected force level for example two newton over a period of time such as four seconds, and generate an unlock control signal 49, an example of a second control signal. Any number of control signals can be provided in such a manner, and not limited to a first control signal and a second control signal. The wired communications path 44 may use a data network, such as a Controller Area Network (CAN bus) or Local Interconnect Network (LIN). Alternatively or additionally, the wired communications path 44 may use a hard-wired configuration, such as a simple high/low or on/off signaling on one or more wire connections.

According to an aspect of the disclosure, the handle ECU 30 is configured to communicate with the electronic latch controller 40 via a wireless communications path 46, such as Bluetooth® as an example of a wireless connection, in response to the wired communications path 44 being unavailable. Hardware devices used for such wireless communications, such as a radio and/or optical transceiver, may be provided, for example, by the output interface 38, and/or by other devices within the handle ECU 30. Coordination of the communications path to be used may be provided by the processor 32 of the handle ECU 30. The wireless communication path 46 may therefore provide a backup communication channel in case of a vehicle accident, allowing the handle assembly 10 to function to open the closure 14 even in the event of damage that interrupts use of the wired communications path 44 between the handle assembly 10 and the electronic latch controller 40. Alternatively, the wireless communication path 46 may be the main communication path. Electronic latch controller 40 may include various hardware and/or software components such as a control unit having processor 40a coupled to a memory 40b, an H-bridge 40c, a backup energy source 40d as examples and without limitation.

As shown in FIG. 11, the processor 32 includes a backup energy diagnostic controller 56, which may include hardware and/or software, and which monitors the local power source 34 within the handle assembly 10, and which may be used, for example, to determine the state of charge, and/or health status of the local power source 34. The processor 32 also includes a backup energy charging controller 58, which may include hardware and/or software, and which controls electrical power sent to or from the local power source 34 within the handle assembly 10, and which may be used, for example, to determine the state of charge, and/or health status of the local power source 34. The processor 32 also includes a force sensor controller 60, which may include hardware and/or software, and which interfaces with the force-based sensor 28 to register a touch by a user, and/or other aspects of such a touches, such as a force level, or a specific sequences of touches as represented by a signal output 29 from force-based sensor 28. The processor 32 also includes a force sensor diagnostic controller 62, which may include hardware and/or software, and which interfaces with the force-based sensor 28 to determine if the force-based sensor 28 is operating properly, and/or to determine a baseline condition of the force-based sensor 28 without being touched, and which may vary depending on temperature, precipitation, or other factors. The processor 32 may also be configured to detect the input or supplied power level from the vehicle battery 50, and determine if there is a failure of the main vehicle battery 50, for example represented by a disconnection 54 over power supply line 53 as shown in FIG. 10, causing the supplied power level to be insufficient to power the handle ECU 30 and/or force based sensor 28, for example which may occur as caused by a depleted main vehicle battery 50, a failure in the wiring leading from the main vehicle battery 50, a crash condition, and other causes.

Figure 13:
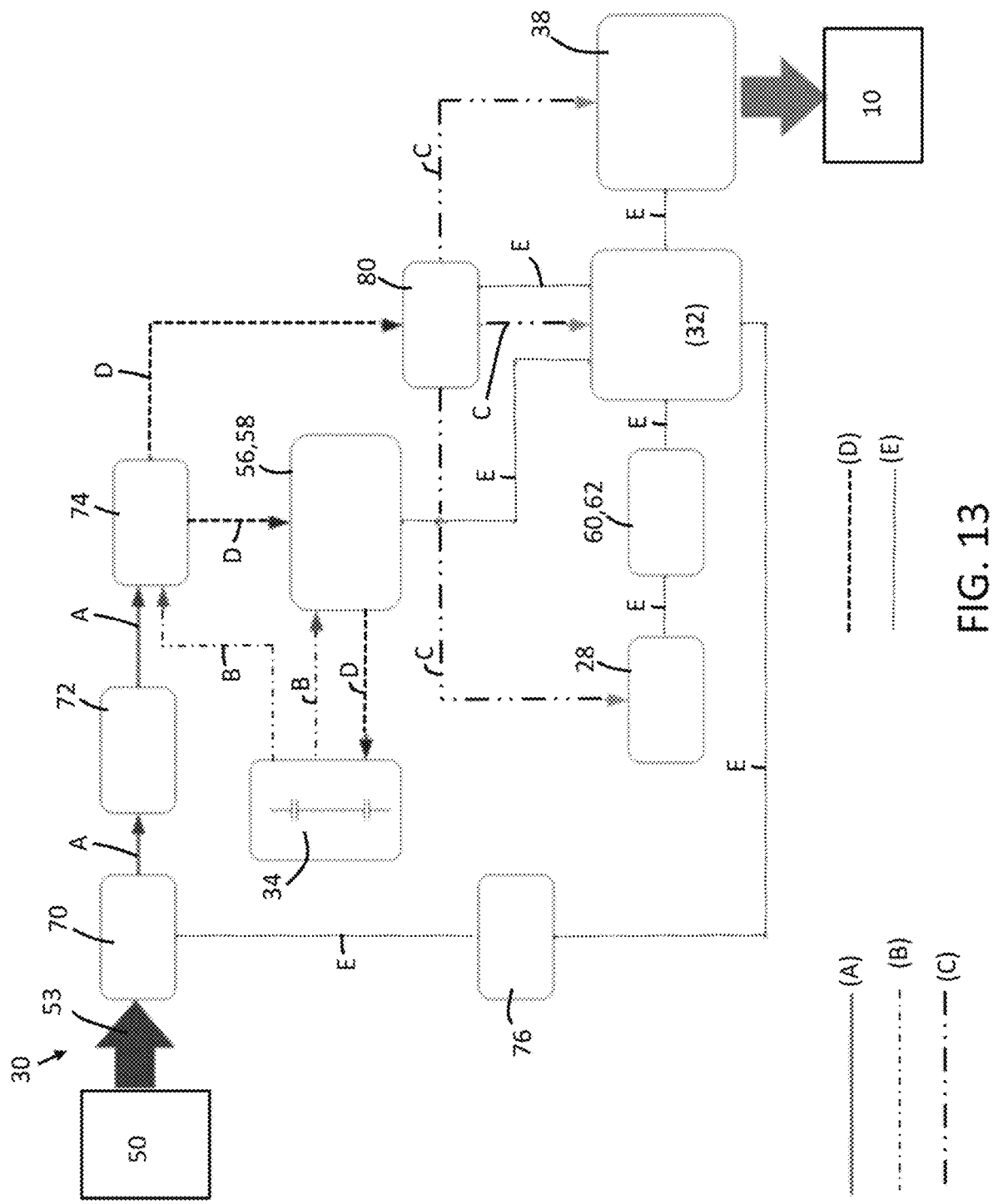
FIG. 13 is a block diagram illustrating different interconnections in an electronic latch controller in accordance with aspects of the disclosure.

As shown in FIG. 13, the handle ECU 30 accepts electrical power from the vehicle battery 50 at a battery input 70, which may be a terminal, connector, wiring harness, or the like. The handle ECU 30 includes a reverse polarity protection circuit 72, functions to prevent damage to the ECU 30 in case the polarity of the vehicle battery 50 is reversed. Electrical power is then supplied to a power supply selector 74, which is configured to use electrical power from the vehicle battery 50 if available, or to draw power from the local power source 34 if necessary. FIG. 13 also illustrates the backup energy diagnostic controller 56 and the backup energy charging controller 58, which may be provided as one or more devices or hardware components, and which function to monitor and to control the charging of the local power source 34.

As also shown in FIG. 13, a battery reading circuit 76 provides information to the processor 32 regarding the status of the vehicle battery 50, such as whether it is connected, and the voltage of the vehicle battery 50, and generally the operating condition of the main vehicle battery 50. An ECU power manager 80, which may include one or more hardware and/or software components, directs electrical power from the power supply selector 74 to one or more of the force-based sensor 28, the processor 32, and the output interface 38. The various different types of interconnections between devices are also illustrated on FIG. 13. The interconnections may include any combination of wires, connectors, such as plug-in connectors, bus bars, PCB traces, integral connections within an integrated circuit, or the like. The interconnections may also include wireless connections, which may use, for example, radio frequency (RF) or optical interconnection paths for providing channels of communications between components.

Figure 14:
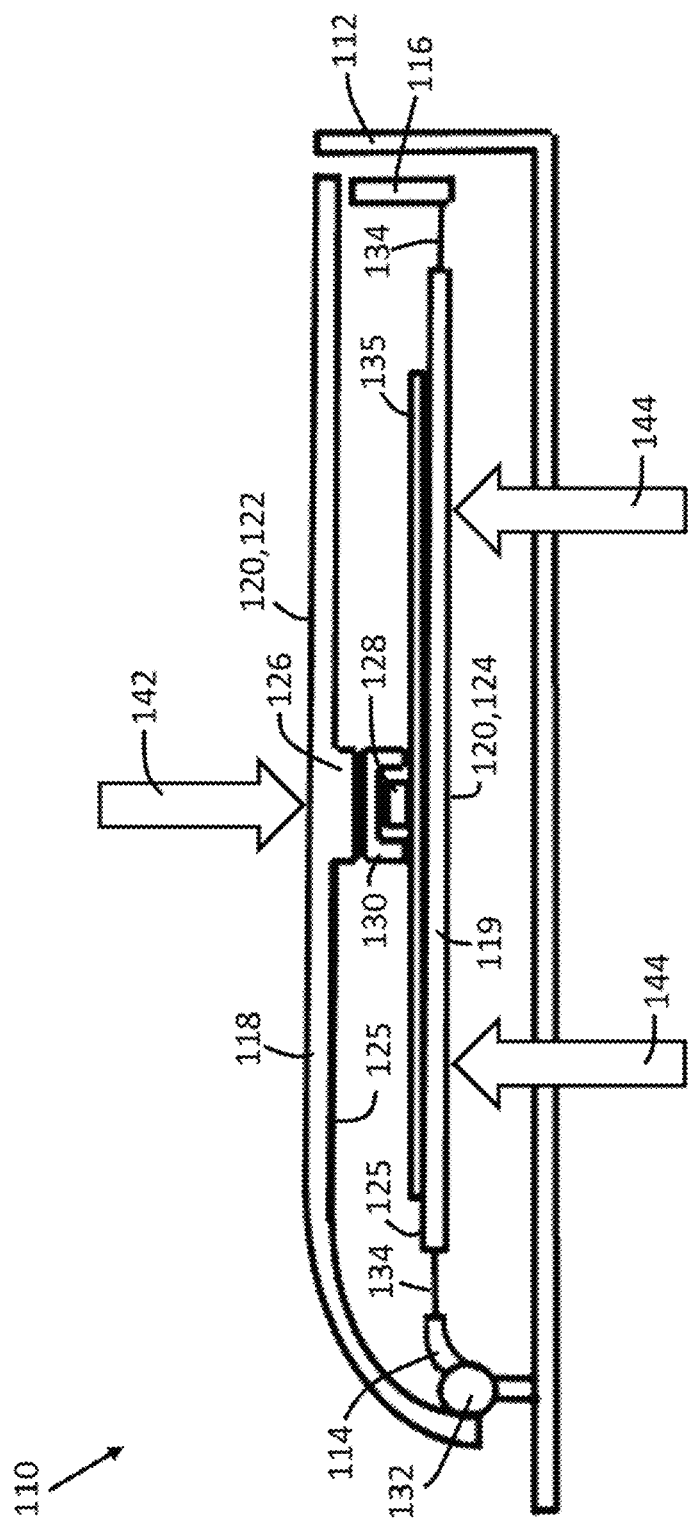
FIG. 14 is a cut-away top view of a portion of a handle assembly in accordance with an embodiment of the disclosure.

FIG. 14 is a cut-away top view of a portion of a handle assembly 110 in accordance with an embodiment of the disclosure. Specifically, the handle assembly 110 includes a handle base 112 that is configured to be fixed to a closure 14 of the vehicle 16, such as a door or a liftgate or a tailgate. The handle assembly 110 includes a first end support 114 and a second end support 116 configured to hold an outer cover 118 and an inner cover 119. The covers 118, 119 each define a class-A surface 120 that is configured to be directly manually manipulated by a user. Specifically, the outer cover 118 defines the class-A surface 120 in the form of an outer surface 122 that faces outwardly and away from the vehicle 16. The inner cover defines the class-A surface 120 in the form of an inner surface 124 that faces inwardly towards the vehicle.

Each of the covers 118, 119 also defines an inside surface 125 that is disposed opposite of the class-A surface 120 and which is not normally visible to a user. The inside surfaces 125 of each of the covers 118, 119 faces toward the other one of the covers 118, 119. The inside surface 125 of the outer cover 118 defines an inward protrusion 126 extending perpendicularly therefrom for engaging a force-based sensor 128 when the outer cover 118 is deformed inwardly as a result of an inward force 142 applied to the outer surface 122. The force-based sensor 128 is disposed upon a handle PCB 135 which is disposed upon the inside surface 125 of the inner cover 119. The handle PCB 135 may be attached to the inside surface 125 of the inner cover 119 with double-sided tape or an adhesive and/or using one or more fasteners.

In some embodiments, and as shown in FIG. 14, a force transmitter 130 may overlie the force-based sensor 128 to spread forces applied thereto to the PCB 135 around the force-based sensor 128. The force transmitter 130 may be made of a resilient material, such as EPDM rubber and may have a U-Shaped cross-section as shown in FIG. 14. The force transmitter 130 may absorb excessive or abuse forces to protect the force-based sensor 128 from damage. Such a configuration is an example of an indirect coupling between the vehicle surface 120 and the force sensor 128, but other couplings may be provided, and for example a direct coupling may be provided in the case where the inner portion of the vehicle surface 120 directly engages the force sensor 128. As another example of a coupling, vehicle surface 120 may be coupled directly or indirectly to a PCB 135 supporting the force sensor 128 which causes a registering of a force by the force sensor 128 when vehicle surface 120 receives an application of force from a user imparting an application of force upon PCB 135.

In some embodiments, the covers 118, 119 may be pivotably coupled to the handle base 112. The covers 118, 119 may thus also be pivotably coupled to the closure of the vehicle. For example, a hinged coupling 132 may join the outer cover 118 to the first end support 114 for allowing pivotal movement between the covers 118, 119 and the handle base 112. This pivotal coupling may be used, for example, to unlatch or to open the vehicle closure.

In some embodiments, and as shown in FIG. 14, a flexible connection 134 couples the inner cover 119 with one or more of the end supports 114, 116, thus allowing the inner cover 119 and the handle PCB 135 to be deflected outwardly toward the outer cover 118 in response to application of an outward force 144 on the inner surface 124. In some embodiments, the flexible connection 134 may completely surround the inner cover 119. The flexible connection 134 may be a thin area or a living hinge that may be integrally formed with the inner cover 119 and one or more of the end supports 114, 116. Alternatively or additionally, the flexible connection 134 may be a separate part, such as a rubber or foam material that connects the inner cover 119 and one or more of the end supports 114, 116.

Figure 15:
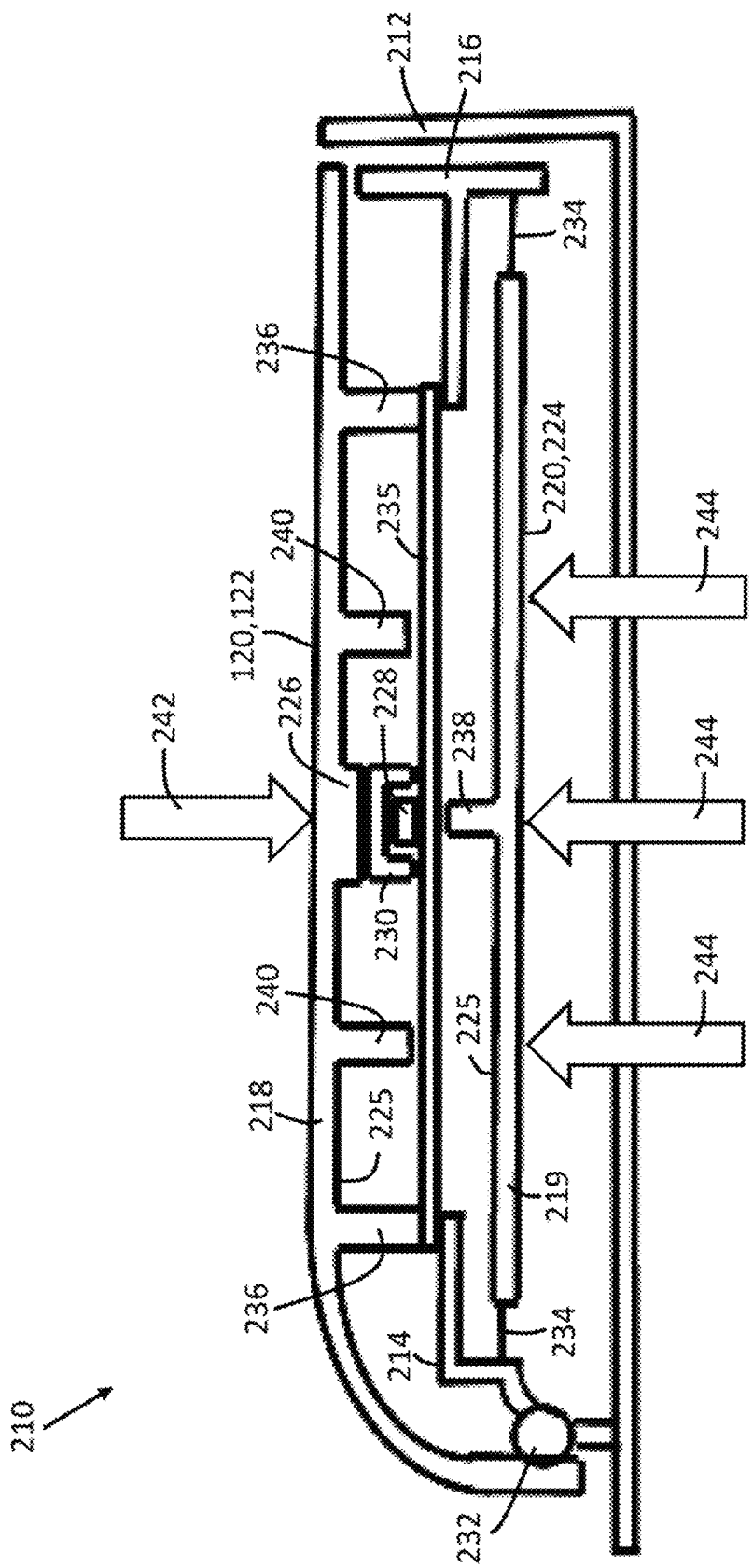
FIG. 15 is a cut-away top view of a portion of a handle assembly in accordance with an embodiment of the disclosure.

FIG. 15 is a cut-away top view of a portion of a handle 210 in accordance with an embodiment of the disclosure. Specifically, the handle assembly 210 includes a handle base 212 that is configured to be fixed to a closure of a vehicle, such as a door or a liftgate or a tailgate. The handle assembly 210 includes a first end support 214 and a second end support 216 configured to hold an outer cover 218 and an inner cover 219. The covers 218, 219 each define a class-A surface 220 that is configured to be directly manually manipulated by a user. Specifically, the outer cover 218 defines the class-A surface 220 in the form of an outer surface 222 that faces outwardly and away from the vehicle. The inner cover defines the class-A surface 220 in the form of an inner surface 224 that faces inwardly towards the vehicle.

Each of the covers 218, 219 also defines an inside surface 225 that is disposed opposite of the class-A surface 220 and which is not normally visible to a user. The inside surfaces 225 of each of the covers 218, 219 faces toward the other one of the covers 218, 219. The inside surface 225 of the outer cover 218 defines an inward protrusion 226 extending perpendicularly therefrom for engaging a force-based sensor 228 when the outer cover 218 is deformed inwardly as a result of an inward force 242 applied to the outer surface 222. The force-based sensor 228 is disposed upon a handle PCB 235 which is disposed between the covers 218, 219 and supported on the end supports 214, 216.

In some embodiments, and as shown on FIG. 15, the outer cover 218 includes support members 236 that extend inwardly from the inside surface 225 thereof perpendicularly to the outer surface 222 for holding the outer cover 218 upon the end supports 114, 116. More specifically, the handle PCB 235 may be clamped between the support members 236 and the end supports 114, 116. Furthermore, and as also shown in FIG. 15, the inner cover 219 includes an outward protrusion 238 extending outwardly from the inside surface 225 thereof and perpendicularly to the inner surface 224 for engaging the handle PCB 235 to cause the force-based sensor 228 to detect pressure applied thereto as a result of the outward force 244 applied to the inner surface 224. In other words, the outward protrusion 238 extends outwardly away from the vehicle closure. In some embodiments, the force-based sensor 228 may detect the outward force 244 by measuring a bending deflection of the handle PCB 235 as a result of it being pushed outwardly by the outward protrusion 238. The outer cover 218 also includes a set of ribs 240 that extend inwardly from the inside surface 225 thereof perpendicularly to the outer surface 222 and between the support members 236 for limiting an amount of outward deflection of the handle PCB 235 that can result from the outward force. In other words, the ribs 240 extend inwardly towards the vehicle closure.

In some embodiments, and as shown in FIG. 15, a force transmitter 230 may overlie the force-based sensor 228 to spread forces applied thereto to the PCB 235 around the force-based sensor 228. The force transmitter 230 may be made of a resilient material, such as EPDM rubber and may have a U-Shaped cross-section. The force transmitter 230 may absorb excessive or abuse forces to protect the force-based sensor 228 from damage. In some embodiments, such as the example shown in FIG. 15, a single force-based sensor 228 may be used for both lock and unlock functions by detecting and differentiating between application of the inward force 242 or the outward force 244.

In some embodiments, the covers 218, 219 may be pivotably coupled to the handle base 212. The covers 118, 119 may thus also be pivotably coupled to the closure of the vehicle. For example, a hinged coupling 232 may join the outer cover 218 to the first end support 214 for allowing pivotal movement between the covers 218, 219 and the handle base 212. This pivotal coupling may be used, for example, to unlatch or to open the vehicle closure.

In some embodiments, and as shown in FIG. 15, a flexible connection 234 couples the inner cover 219 with one or more of the end supports 214, 216, thus allowing the inner cover 219 to be deflected outwardly toward the outer cover 218 in response to application of an outward force 244 on the inner surface 224. In some embodiments, the flexible connection 234 may completely surround the inner cover 219. The flexible connection 234 may be a thin area or a living hinge that may be integrally formed with the inner cover 219 and one or more of the end supports 214, 216. Alternatively or additionally, the flexible connection 234 may be a separate part, such as a rubber or foam material that connects the inner cover 219 and one or more of the end supports 214, 216.

Figure 16:
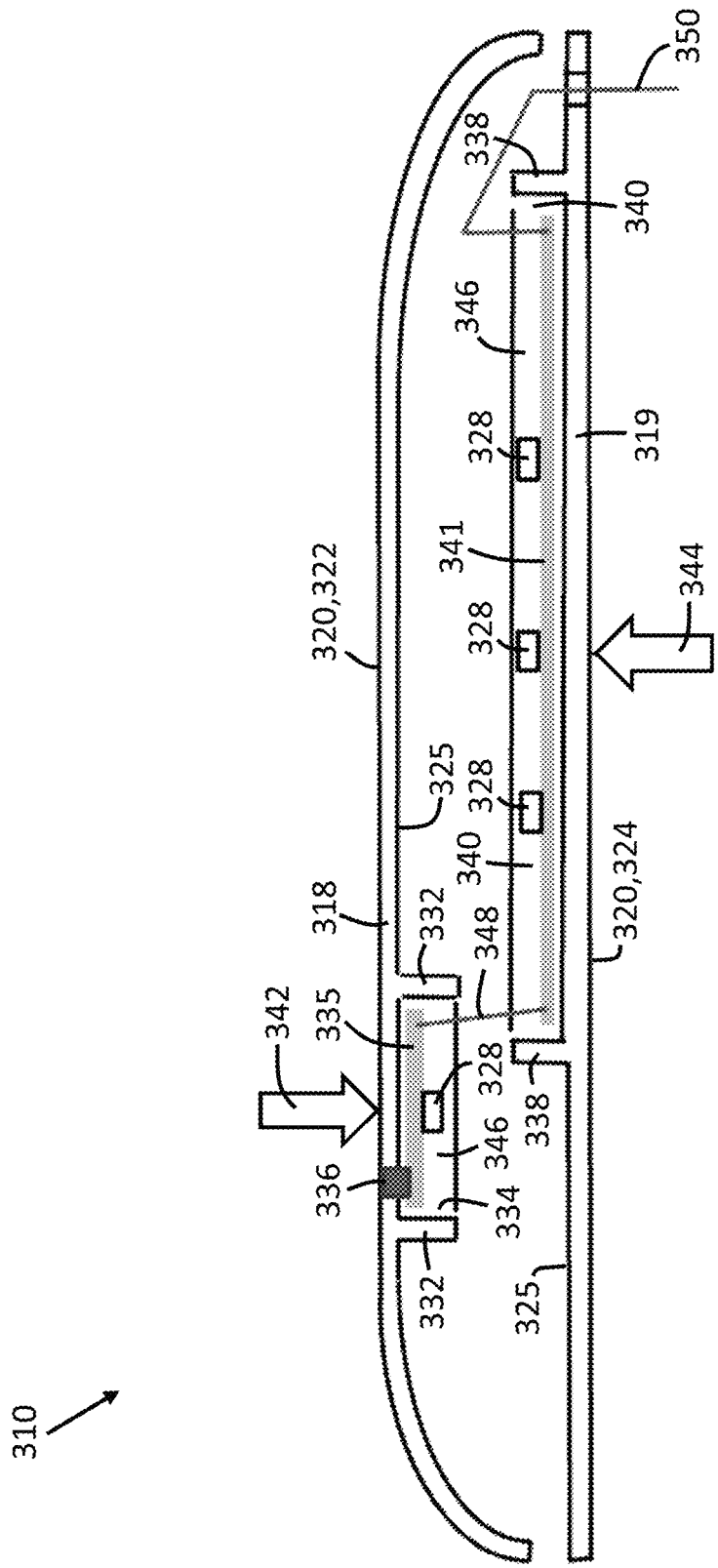
FIG. 16 is a cut-away top view of a portion of a handle assembly in accordance with an embodiment of the disclosure.

FIG. 16 is a cut-away top view of a portion of a handle assembly 310 for a closure of a vehicle, such as a door or a liftgate or a tailgate in accordance with an embodiment of the disclosure. Specifically, the handle assembly 310 includes an outer cover 318 and an inner cover 319. The covers 318, 319 each define a class-A surface 320 that is configured to be directly manually manipulated by a user. Specifically, the outer cover 318 defines the class-A surface 320 in the form of an outer surface 322 that faces outwardly and away from the vehicle. The inner cover defines the class-A surface 320 in the form of an inner surface 324 that faces inwardly towards the vehicle.

Each of the covers 318, 319 also defines an inside surface 325 that is disposed opposite of the class-A surface 320 and which is not normally visible to a user. The inside surfaces 325 of each of the covers 318, 319 faces toward the other one of the covers 318, 319. The inside surface 325 of the outer cover 318 defines a first wall 332 extending perpendicularly therefrom and enclosing a first well area 334. A force-based sensor 328 is disposed within the first well area 334 and is configured to sense a deflection of the outer cover 318 as a result of application of an inward force 342 to the outer surface 322. Specifically, a first PCB 335 is disposed within the first well area 334, with the force-based sensor 328 disposed thereupon. The first PCB 335 may be attached to the inside surface 325 of the outer cover 318 with double-sided tape or an adhesive and/or using one or more fasteners.

In some embodiments, a visual indicator, such as an LED 336 is also disposed within the first well area 334 for illuminating to provide feedback information to a user. Well area 334 may be a thinned portion of covers 318, 319, or a light transmissive portion of covers 318, 319, or finished to allow light transmissivity, as examples. A sealant 346, such as epoxy or potting material covers the first PCB 335 and the force-based sensor 328 for protecting those devices from moisture and/or from damage due to vibration or shock forces.

The inside surface 325 of the inner cover 319 defines a second wall 338 extending perpendicularly therefrom and enclosing a second well area 340. One or more force-based sensors 328 are disposed within the second well area 340 and are configured to sense a deflection of the inner cover 319 as a result of application of an outward force 344 to the inner surface 324. Specifically, a second PCB 341 is disposed within the second well area 340, with the force-based sensor 328 disposed thereupon. The second PCB 341 may be attached to the inside surface 325 of the inner cover 319 with double-sided tape or an adhesive and/or using one or more fasteners. A sealant 346, such as epoxy or potting material covers the second PCB 341 and the force-based sensors 328 for protecting those devices from moisture and/or from damage due to vibration or shock forces. An electrical interconnection 348, such as one or more wires, pin connections, a ribbon cable, or another conductor or conductors, connects the second PCB 341 to the first PCB 335. A wiring harness 350, which may include one or more wires, pin connectors, a ribbon cable, or another conductor or conductors connects the second PCB 341 to external devices. The wiring harness 350 may serve as the wired communications path 44 described above.

One or both of the first PCB 335 and/or the second PCB 341 may be configured to be deformed as a result of application of an inward force 342 or an outward force 342. The deformation of the PCB 335, 341 may then be sensed by a corresponding force-based sensor 328. In some embodiments, a single force-based sensor 328 may be used for both lock and unlock functions by detecting and differentiating between application of the inward force 342 or the outward force 344.

Figure 17:
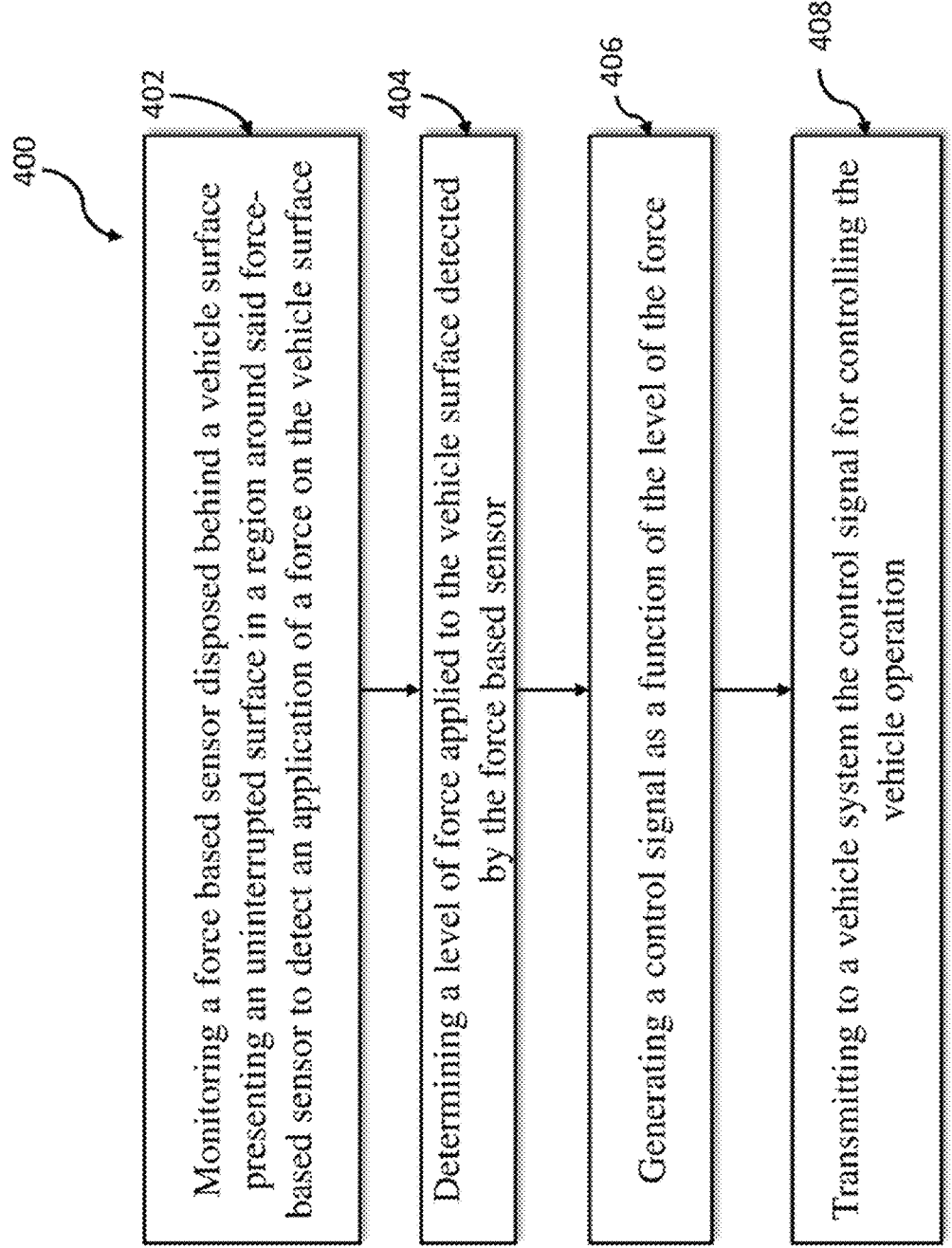
FIG. 17 illustrates a flowchart of operations performed by an interface ECU of the handle assembly of FIG. 1, in accordance with an illustrative embodiment.

Now referring to FIG. 17, the interface ECU 30 (or controller 30) may be configured to perform the steps of a method of operating a user interface system or assembly for controlling a vehicle operation 400 including the steps of monitoring a force based sensor disposed behind a vehicle surface presenting an uninterrupted surface in a region around the force-based sensor to detect an application of a force on the vehicle surface 402, determining a level of force applied to the vehicle surface detected by the force based sensor 404, generating a control signal as a function of the level of the force 406, and transmitting to a vehicle system the control signal for controlling the vehicle operation 408.

Figure 18:
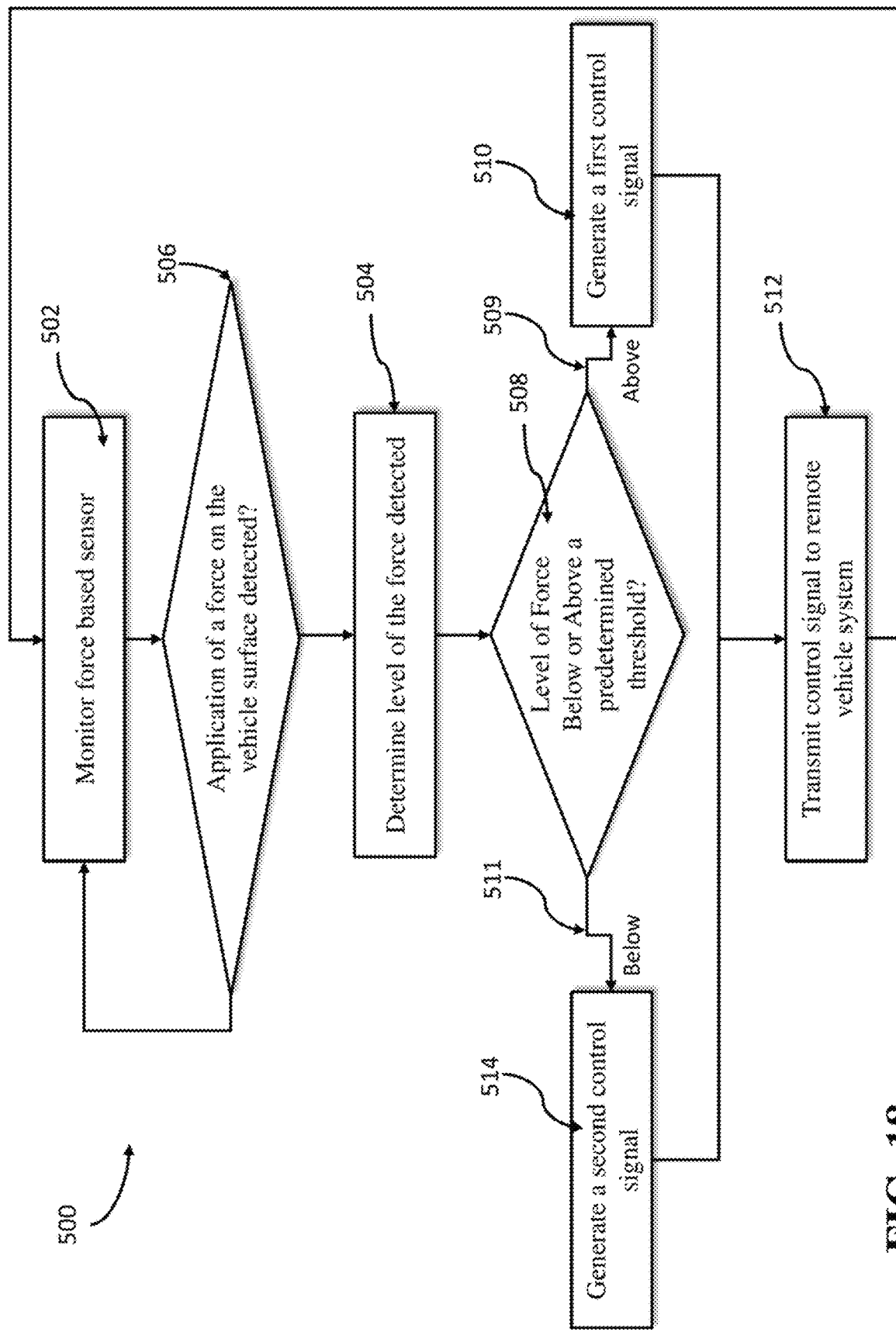
FIG. 18 illustrates another flowchart of operations performed by an interface ECU of the handle assembly of FIG. 1, in accordance with an illustrative embodiment.

Now referring to FIG. 18, the interface ECU 30 (or controller 30) may be configured to perform the steps of a method of operating a user interface system or assembly for controlling a vehicle operation 500 including the steps of monitoring the force based sensor disposed behind a vehicle surface presenting an uninterrupted surface in a region around the force-based sensor to detect an application of a force on the vehicle surface 502, determining the level of the force detected 504 in response to determining if an application of force on the vehicle surface has been detected at step 506, then determining if the level of force is below or above a predetermined threshold 508. If at step 508 the interface ECU determines the level of force is above 509 the predetermined threshold (for example above 1 Newton), then the interface ECU may generate a first control signal representing a vehicle system function 510, and then proceeds to transmit the first control signal to remote vehicle system 512, such as the latch controller for example. If at step 508 the interface ECU determines the level of force is below 511 the predetermined threshold, then the interface ECU may generate a second control signal representing a vehicle system function 514, and then proceeds to transmit the second control signal to remote vehicle system 512. Interface ECU may then return to the step of monitoring the force based sensor at step 502.

Figure 19:
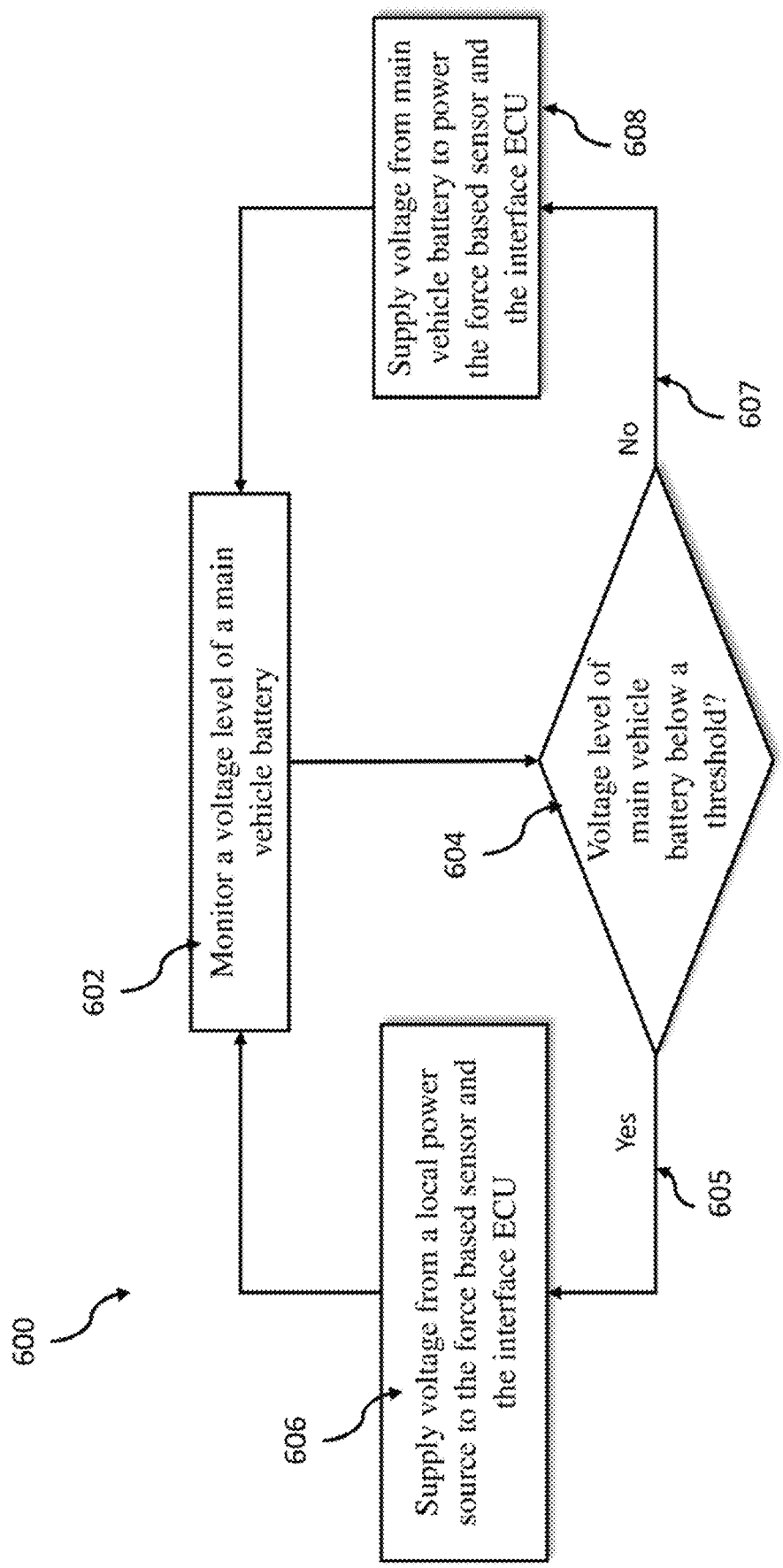
FIG. 19 illustrates yet another flowchart of operations performed by an interface ECU of the handle assembly of FIG. 1, in accordance with an illustrative embodiment.

Now referring to FIG. 19, the interface ECU 30 (or controller 30) may be configured to perform the steps of a method of operating a user interface system or assembly for controlling a vehicle operation 600 including the steps of monitoring a voltage level of a main vehicle battery 602, determining if the voltage level of the main vehicle battery is below a threshold 604 (for example below 12 Volts), for example as a result of a failure of the main vehicle battery. If at step 604 the interface ECU determines the voltage level of the main vehicle battery is below 605 a threshold, then the interface ECU may supply voltage from a local power source to the force based sensor and the interface ECU 606. If at step 604 the interface ECU determines the voltage level of the main vehicle battery is above 607 a threshold, then the interface ECU may supply voltage from main vehicle battery to power the force based sensor and the interface ECU 608. Interface ECU may then be configured to return to the step of monitoring a voltage level of a main vehicle battery at step 602.

The teachings herein may also be applied as part of a user interface system having a distributed configuration compared to the illustrated localized assembly of user interface assembly 10. For example, force based sensor 28 may be provided within handle assembly 10 while controller 30 may be provided remote from handle assembly 10, and may for example be integrated with the latch assembly and integrated as part of latch controller 40 as an example.

Now referring back to FIG. 10, there is illustrated an access system 700 for a closure panel of a vehicle including a latch assembly 12, 21' having a latch controller 40, an actuation group 39 controlled by the latch controller 40, and a backup energy source 40d for supplying power to the latch controller 40 and the actuation group 39 in the event of a failure of a main vehicle power source 50, the access system 700 further having a user interface assembly 10 including a force based sensor 28 disposed behind a vehicle surface presenting an uninterrupted surface in a region around the force-based sensor 28 to detect an application of a force on the vehicle surface, a user interface controller 30 in communication with the force based sensor 28 and the latch controller 40 and a local backup energy source 34 for supplying power to the user interface controller 30 and the force based sensor 28 in the event of a failure of the main vehicle power source 50, such that during the failure of the main vehicle power source 50 the user interface controller 30 is configured to receive power from the local backup energy source 34 and is further configured to detect using the force based sensor 28 an application of a force on the vehicle surface, and transmit to the latch controller 40 a control signal 45 for controlling the actuation group 39 using power from the backup energy source 40d.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A user interface system for a vehicle comprising a latch assembly having a latch controller, an actuation group controlled by the latch controller, and a first backup energy source for supplying power to the latch controller and the actuation group in the event of a failure of a main vehicle power source:

a vehicle surface disposed over a force-based sensor responsive to a force applied to the vehicle surface; and a second backup energy source for providing power to the force-based sensor in the event a main vehicle power is not available to power the force-based sensor, wherein said vehicle surface presents an uninterrupted surface in a region around said force-based sensor.

2. The user interface system of claim 1, wherein said vehicle surface is configured to deform to transmit a force applied thereto to said force-based sensor.

3. The user interface system of claim 1, further comprising:
a cover defining said vehicle surface, said cover pivotably coupled to a closure of the vehicle.

4. The user interface system of claim 1, further comprising:
a cover defining said vehicle surface, said cover supported by a flexible connection and movable relative to a closure of the vehicle.

5. The user interface system of claim 4, wherein said cover comprises an inner cover defining said vehicle surface as an inner surface facing toward the closure of the vehicle, with said cover being movable outwardly in response to an outward force away from the closure of the vehicle.

6. The user interface system of claim 5, wherein said inner cover includes an outward protrusion extending outwardly away from the closure for engaging a printed circuit board and causing the printed circuit board to be deflected outwardly.

7. The user interface system of claim 1, further comprising a controller including a processor configured to monitor said force-based sensor, wherein said controller, said second backup energy source and said force-based sensor are disposed upon a printed circuit board.

8. The user interface system of claim 1, wherein the vehicle surface is a class A-vehicle surface.

9. The user interface system of claim 1, wherein the vehicle surface is provided on one of a vehicle handle and a vehicle applique.

10. The user interface system of claim 1, wherein the vehicle surface includes a tactile feature disposed on the vehicle surface, wherein the tactile feature is selected from a group consisting of braille, a logo, a symbol, a text, a depression, or a proturbance.

11. The user interface system of claim 1, further comprising an interface controller in communication with the force-based sensor and a remote vehicle system, the interface controller configured to:
monitor the force-based sensor to detect an application of a force on the vehicle surface;
generate a control signal as a function of a level of the force detected; and
transmit the control signal to a vehicle system for controlling the vehicle operation.

12. The user interface system of claim 7, wherein said force-based sensor is configured to detect a deformation of the printed circuit board.

13. The user interface system of claim 7, wherein said force-based sensor is provided on one side of the printed circuit board adjacent the vehicle surface and the controller and the back up power source are provided on an opposite side of the printed circuit board.

* * * * *